United States Patent
Tomeba et al.

(10) Patent No.: US 11,169,439 B2
(45) Date of Patent: Nov. 9, 2021

(54) COLORING COMPOSITION AND METHOD FOR PRODUCING FILM

(71) Applicant: FUJIFILM Corporation, Tokyo (JP)

(72) Inventors: Hisamitsu Tomeba, Haibara-gun (JP); Kaoru Aoyagi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 418 days.

(21) Appl. No.: 16/211,715

(22) Filed: Dec. 6, 2018

(65) Prior Publication Data

US 2019/0113840 A1 Apr. 18, 2019

Related U.S. Application Data

(63) Continuation of application No. PCT/JP2017/020524, filed on Jun. 2, 2017.

(30) Foreign Application Priority Data

Jun. 9, 2016 (JP) .............................. JP2016-115239

(51) Int. Cl.
| | |
|---|---|
| *G02B 5/20* | (2006.01) |
| *G03F 7/004* | (2006.01) |
| *G03F 7/00* | (2006.01) |
| *G02B 5/22* | (2006.01) |
| *G03F 7/027* | (2006.01) |
| *G02B 1/04* | (2006.01) |
| *G03F 7/031* | (2006.01) |
| *G03F 7/033* | (2006.01) |
| *G03F 7/038* | (2006.01) |
| *G03F 7/039* | (2006.01) |
| *G03F 7/16* | (2006.01) |
| *G03F 7/20* | (2006.01) |
| *G03F 7/32* | (2006.01) |
| *G03F 7/40* | (2006.01) |

(52) U.S. Cl.
CPC ............ *G03F 7/0007* (2013.01); *G02B 1/04* (2013.01); *G02B 5/20* (2013.01); *G02B 5/201* (2013.01); *G02B 5/223* (2013.01); *G03F 7/0048* (2013.01); *G03F 7/027* (2013.01); *G03F 7/031* (2013.01); *G03F 7/033* (2013.01); *G03F 7/038* (2013.01); *G03F 7/039* (2013.01); *G03F 7/162* (2013.01); *G03F 7/168* (2013.01); *G03F 7/2004* (2013.01); *G03F 7/32* (2013.01); *G03F 7/40* (2013.01)

(58) Field of Classification Search
CPC ........ G03F 7/0007; G03F 7/027; G03F 7/028; G03F 7/031; G03F 7/033; G03F 7/038; G03F 7/105; G02B 5/223
USPC .............................................. 430/7; 349/106
See application file for complete search history.

(56) References Cited

U.S. PATENT DOCUMENTS

| | | |
|---|---|---|
| 8,663,880 B2 | 3/2014 | Shimada et al. |
| 2011/0217637 A1 | 9/2011 | Shimada et al. |
| 2017/0166762 A1 | 6/2017 | Tomeba |

FOREIGN PATENT DOCUMENTS

| | | |
|---|---|---|
| JP | 2004-233974 A | 8/2004 |
| JP | 2005-173325 A | 6/2005 |
| JP | 2005-292305 A | 10/2005 |
| JP | 2009-237162 A | 10/2009 |
| JP | 2010-266861 A | 11/2010 |
| JP | 2013-045088 A | 3/2013 |
| JP | 2013-050524 A | 3/2013 |
| JP | 2013-114184 A | 6/2013 |
| JP | 2016-75832 A | 5/2016 |
| WO | 2016/035633 A1 | 3/2016 |

OTHER PUBLICATIONS

Office Action dated Feb. 18, 2021 from the Korean Intellectual Property Office in Korean Application No. 10-2018-7034625.
Office Action dated Oct. 28, 2020, issued by the Korean Intellectual Property Office in Korean Application No. 10-2018-7034625.
Office Action dated Oct. 27, 2020, issued by the Taiwanese Intellectual Property Office in Taiwanese Application No. 106118770.
Office Action dated May 26, 2020, from the Japanese Patent Office in Japanese application No. 2018-522444.
International Search Report dated Aug. 29, 2017, issued by the International Searching Authority in application No. PCT/JP2017/020524.
International Preliminary Report on Patentability with translation of Written Opinion dated Dec. 11, 2018, issued by the International Searching Authority in application No. PCT/JP2017/020524.
Written Opinion dated Aug. 29, 2017, issued by the International Searching Authority in application No. PCT/JP2017/020524.
Office Action dated Mar. 18, 2020, from the Korean Intellectual Property Office in Korean Application No. 10-2018-7034625.
Office Action dated Dec. 17, 2019 from the Japanese Patent Office in counterpart JP Application No. 2018-522444.

*Primary Examiner* — John A McPherson
(74) *Attorney, Agent, or Firm* — Sughrue Mion, PLLC

(57) ABSTRACT

Provided are a coloring composition capable of producing a film with suppressed occurrence of striation, and a method for producing a film. The coloring composition includes a coloring agent A, a resin B, a polymerizable compound C, a photopolymerization initiator D, and an organic solvent E, in which the organic solvent E includes an ester-based solvent E1 having a surface tension at 25° C. of from 25 mN/m to 35 mN/m, an organic solvent E2 having a surface tension at 25° C. of less than 25 mN/m, a ratio of a mass of the ester-based solvent E1 to the mass of the organic solvent E2 is 80:20 to 30:70 in terms of the ratio of the mass of the ester-based solvent E1:the mass of the organic solvent E2, and the organic solvent E contains 50% by mass or more of a combination of the ester-based solvent E1 and the organic solvent E2 with respect to the total mass of the organic solvent E.

19 Claims, No Drawings

COLORING COMPOSITION AND METHOD FOR PRODUCING FILM

CROSS-REFERENCE TO RELATED APPLICATIONS

This application is a Continuation of PCT International Application No. PCT/JP2017/020524 filed on Jun. 2, 2017, which claims priority under 35 U.S.C § 119(a) to Japanese Patent Application No. 2016-115239 filed on Jun. 9, 2016. Each of the above application(s) is hereby expressly incorporated by reference, in its entirety, into the present application.

BACKGROUND OF THE INVENTION

1. Field of the Invention

The present invention relates to a coloring composition. The present invention also relates to a method for producing a film using the coloring composition.

2. Description of the Related Art

As a digital camera, a mobile phone with a camera, and the like have been further spreading in recent years, there has been an increasing demand for a solid-state imaging device such as a charge-coupled device (CCD) image sensor. A color filter has been used as a key device in a display or an optical element.

A color filter has been produced by applying a coloring composition including a coloring agent, a resin, a polymerizable compound, a photopolymerization initiator, and an organic solvent onto a substrate or the like (see JP2013-045088A and JP2013-114184A).

SUMMARY OF THE INVENTION

In the production of a film by applying a coloring composition onto a substrate or the like, it has been desired to further improve coatability. In particular, in a case where a coloring composition is applied onto a surface having floor level difference such as unevenness, it has recently been desired to suppress generation of radial streaks called a striation.

Therefore, an object of the present invention is to provide a coloring composition capable of suppressing occurrence of striation and a method for producing a film.

The present inventors have conducted extensive studies, and as a result, they have found that the object can be accomplished by using a coloring composition which will be described later, leading to the completion of the present invention. That is, the present invention is as follows.

<1> A coloring composition comprising:
a coloring agent A;
a resin B;
a polymerizable compound C;
a photopolymerization initiator D; and
an organic solvent E,
in which the organic solvent E includes an ester-based solvent E1 having a surface tension at 25° C. of from 25 mN/m to 35 mN/m, an organic solvent E2 having a surface tension at 25° C. of less than 25 mN/m,
a ratio of a mass of the ester-based solvent E1 to a mass of the organic solvent E2 is 80:20 to 30:70 in terms of the ratio of the mass of the ester-based solvent E1:the mass of the organic solvent E2, and
the organic solvent E contains 50% by mass or more of a combination of the ester-based solvent E1 and the organic solvent E2 with respect to the total mass of the organic solvent E.

<2> The coloring composition as described in <1>,
in which a boiling point of the organic solvent E2 is 50° C. to 135° C.

<3> The coloring composition as described in <1> or <2>,
in which a boiling point of the ester-based solvent E1 is 140° C. to 180° C.

<4> The coloring composition as described in any one of <1> to <3>,
in which the organic solvent E2 has a solubility in 100 g of water at 25° C. of 30 g or less.

<5> The coloring composition as described in any one of <1> to <4>,
in which the ester-based solvent E1 is a compound having an ether bond and an ester bond, and
the organic solvent E2 is a compound having an ester bond.

<6> The coloring composition as described in any one of <1> to <5>,
in which the ester-based solvent E1 is at least one selected from propylene glycol monomethyl ether acetate, propylene glycol monoethyl ether acetate, or ethyl 3-ethoxypropionate.

<7> The coloring composition as described in any one of <1> to <6>,
in which the organic solvent E2 is a compound represented by Formula (E2-1);

$$R^{e1}-C(=O)-O-R^{e2} \quad (E2\text{-}1)$$

in the formula, $R^{e1}$ and $R^{e2}$ each independently represent a hydrocarbon group.

<8> The coloring composition as described in any one of <1> to <7>,
in which the organic solvent E2 is at least one selected from methyl acetate, ethyl acetate, propyl acetate, isopropyl acetate, or butyl acetate.

<9> The coloring composition as described in any one of <1> to <8>,
in which the organic solvent E includes a ketone-based solvent E3.

<10> The coloring composition as described in any one of <1> to <9>,
in which the surface tension at 25° C. of the organic solvent E is from 22 mN/m to 29 mN/m.

<11> The coloring composition as described in any one of <1> to <10>,
in which the coloring composition includes 40% to 95% by mass of the organic solvent E.

<12> The coloring composition as described in any one of <1> to <11>,
in which the polymerizable compound C includes a polymerizable compound having an acid group.

<13> A method for producing a film, comprising applying the coloring composition as described in any one of <1> to <12> onto a support.

<14> The method for producing a film as described in <13>, further comprising forming a pattern.

According to the present invention, it is possible to provide a coloring composition capable of producing a film with suppressed occurrence of striation, and a method for producing a film.

DESCRIPTION OF THE PREFERRED EMBODIMENTS

Hereinafter, the contents of the present invention will be described in detail.

In citations for a group (atomic group) in the present specification, in a case where the group (atomic group) is denoted without specifying whether it is substituted or unsubstituted, the group (atomic group) includes both a group (atomic group) having no substituent and a group (atomic group) having a substituent. For example, an "alkyl group" includes not only an alkyl group having no substituent (unsubstituted alkyl group), but also an alkyl group having a substituent (substituted alkyl group).

In the present specification, "exposure" includes, unless otherwise specified, not only exposure using light but also lithography using particle rays such as electron beams and ion beams. In addition, examples of light used for the exposure generally include actinic rays or radiation such as a bright line spectrum of a mercury lamp, far ultraviolet rays typified by an excimer laser, extreme ultraviolet rays (EUV light), X-rays, electron beams, or the like.

In the present specification, a numerical range expressed using "to" means a range that includes the preceding and succeeding numerical values of "to" as the lower limit value and the upper limit value, respectively.

In the present specification, the total solid content refers to a total amount of the components other than a solvent from all the components of a composition.

In the present specification, "(meth)acrylate" represents either or both of acrylate and methacrylate, "(meth)acryl" represents either or both of acryl and methacryl, "(meth)allyl" represents either or both of allyl and methallyl, and "(meth)acryloyl" represents either or both of acryloyl and methacryloyl.

In the present specification, a term "step" not only represents an independent step, but also includes a step which is not clearly distinguished from other steps in a case where an intended action of the step is obtained.

In the present specification, a weight-average molecular weight (Mw) and a number-average molecular weight (Mn) are each defined as a value in terms of polystyrene through measurement by means of gel permeation chromatography (GPC).

<Coloring Composition>

The coloring composition of the embodiment of the present invention is a coloring composition including a coloring agent A, a resin B, a polymerizable compound C, a photopolymerization initiator D, and an organic solvent E, in which the organic solvent E includes an ester-based solvent E1 having a surface tension at 25° C. of from 25 mN/m to 35 mN/m, an organic solvent E2 having a surface tension at 25° C. of less than 25 mN/m, a ratio of a mass e1 of the ester-based solvent E1 to a mass e2 of the organic solvent E2 is 80:20 to 30:70 in terms of the ratio of the mass e1 of the ester-based solvent E1:the mass e2 of the organic solvent E2, and the organic solvent E contains 50% by mass or more of a combination of the ester-based solvent E1 and the organic solvent E2 with respect to the total mass of the organic solvent E.

By the coloring composition of the embodiment of the present invention, it is possible to suppress the occurrence of striation during the application, thereby obtaining a coloring composition having excellent coatability. A mechanism for obtaining such an effect is not clear, but it is presumed that by using the ester-based solvent E1 and the organic solvent E2 as described above in combination at the above-mentioned specific ratio, wettability of the coloring composition for the support or the like or a drying property of the coloring composition is appropriately adjusted, and as a result, the occurrence of striation can be suppressed. Hereinafter, the respective components of the coloring composition of the embodiment of the present invention will be described.

<<Coloring Agent>>

The coloring composition of the embodiment of the present invention includes a coloring agent. The coloring agent may be either one of a dye and a pigment, or the both may be used in combination. Examples of the pigment include various inorganic pigments or organic pigments known in the related art. The average particle diameter of the pigments is preferably 0.01 to 0.1 μm, and preferably 0.01 to 0.05 μm.

Examples of the inorganic pigment include black pigments such as carbon black and titanium black; and metal compounds such as oxides (metal oxides) and composite salts (metal complex salts) of metals such as iron, cobalt, aluminum, cadmium, lead, copper, titanium, magnesium, chromium, zinc, and antimony.

Examples of the organic pigments include the following pigments.

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all yellow pigments);

C. I. Pigment Orange 2, 5, 13, 16, 17:1, 31, 34, 36, 38, 43, 46, 48, 49, 51, 52, 55, 59, 60, 61, 62, 64, 71, and 73 (all orange pigments);

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all red pigments);

C. I. Pigment Green 7, 10, 36, and 37 (all green pigments);

C. I. Pigment Violet 1, 19, 23, 27, 32, 37, 42, 58, and 59 (all violet pigments);

C. I. Pigment Blue 1, 2, 15, 15:1, 15:2, 15:3, 15:4, 15:6, 16, 22, 60, 64, 66, 79, and 80 (all blue pigments).

Furthermore, as a green pigment, a halogenated zinc phthalocyanine pigment having 10 to 14 halogen atoms on average 8 to 12 bromine atoms on average, and 2 to 5 chlorine atoms on average in the molecule can also be used. Specific examples thereof include the compounds described in WO2015/118720A.

In addition, as the blue pigment, an aluminum phthalocyanine compound having a phosphorus atom can also be used. Specific examples thereof include the compounds described in paragraph Nos. 0022 to 0030 of JP2012-247591A and the compounds described in paragraph No. 0047 of JP2011-157478A.

These organic pigments may be used singly or in combination of various pigments to improve color purity.

Examples of the dye include the dyes disclosed in JP1989-090403A (JP-S64-090403A) JP1989-091102A (JP-S64-091102A), JP1989-094301A (JP-H01-094301A), JP1994-011614A (JP-H06-011614A), JP2592207B, U.S. Pat. Nos. 4,808,501B, 5,667,920B, 0,505,950B, 5,667,920B, JP1993-333207A (JP-H05-333207A), JP1994-035183A (JP-H06-035183A), JP1994-051115A (JP-H06-051115A), and JP1994-194828A (JP-H06-194828A). In terms of classification based on the chemical structure, examples of the dye include a pyrazoleazo compound, a pyrromethene compound, an anilinoazo compound, a triarylmethane compound, an anthraquinone compound, a benzylidene compound, an oxonol compound, a pyrazolotriazoleazo compound, a pyridoneazo compound, a cyanine compound, a phenothiazine compound, and a pyrrolopyrazoleazomethine compound.

Moreover, as the coloring agent, a dye multimer can be used. The dye multimer is preferably a dye that is used after being dissolved in a solvent, but the dye multimer may form a particle. In a case where the dye multimer is the particle, it is usually used in a state of being dispersed in a solvent. The dye multimer in the particle state can be obtained by, for example, emulsion polymerization. Examples of the dye multimer in the state of particles include the compounds described in JP2015-214682A. In addition, as the dye multimer, the compounds described in JP2011-213925A, JP2013-041097A, JP2015-028144A, JP2015-030742A, or the like can also be used.

In addition, as the yellow coloring agent, the quinophthalone compounds described in paragraph Nos. 0011 to 0034 of JP2013-054339A, the quinophthalone compounds described in paragraph Nos. 0013 to 0058 of JP2014-026228A, or the like can also be used.

The content of the coloring agent is preferably 10% by mass or more, more preferably 20% by mass or more, and still more preferably 30% by mass or more, with respect to the total solid content of the coloring composition. The upper limit is preferably 80% by mass or less, more preferably 75% by mass or less, and still more preferably 70% by mass or less. The coloring agent included in the coloring composition may be of one kind thereof or of two or more kinds thereof. In a case where two or more kinds of the coloring agents are included, the total amount thereof preferably falls within the range.

<<Resin>>

The coloring composition of the embodiment of the present invention includes a resin. The resin is blended in applications, such as an application for dispersing particles such as a pigment in the composition or an application as a binder. Incidentally, a resin which is usually used for dispersing particles such as a pigment is also referred to as a dispersant. However, such applications of the resin are only exemplary, and the resin can also be used for other purposes, in addition to the above-mentioned applications.

The content of the resin in the coloring composition of the embodiment of the present invention is preferably 1% to 80% by mass with respect to the total solid content of the coloring composition. The lower limit is more preferably 5% by mass or more, and still more preferably 10% by mass or more. The upper limit is more preferably 70% by mass or less, and still more preferably 60% by mass or less.

<<<Dispersant>>>

The coloring composition of the embodiment of the present invention preferably includes a dispersant as the resin. In particular, in a case where a pigment is used as a coloring agent, it is preferable that the coloring composition includes the dispersant. Examples of the dispersant include an acidic dispersant (acidic resin) and a basic dispersant (basic resin).

Here, the acidic dispersant (acidic resin) indicates a resin in which the amount of acid groups is more than that of basic groups. As the acidic dispersant (acidic resin), a resin in which the amount of the acid groups is 70% by mole or more with respect to 100% by mole of the total amount of the acid groups and the basic groups is preferable, and a resin which is only substantially formed of acid groups is more preferable. The acid group contained in the acidic dispersant (acidic resin) is preferably a carboxyl group. The acid value of the acidic dispersant (acidic resin) is preferably 5 to 105 mgKOH/g.

Furthermore, the basic dispersant (basic resin) indicates a resin in which the amount of acid groups is more than that of basic groups. As the basic dispersant (basic resin), a resin in which the amount of the basic groups is more than 50% by mole with respect to 100% by mole of the total amount of the acid groups and the basic groups is preferable. The basic group contained in the basic dispersant is preferably an amino group.

Examples of the dispersant include polymer dispersants [for example, a polyamidoamine and a salt thereof, a polycarboxylic acid and a salt thereof, an unsaturated high-molecular-weight acid ester, a modified polyurethane, a modified polyester, a modified poly (meth)acrylate, a (meth) acrylic copolymer, and a naphthalenesulfonic acid/formalin condensate], a polyoxyethylene alkyl phosphate ester, a polyoxyethylene alkylamine, and an alkanolamine.

The polymer dispersant can further be classified into a linear polymer, a terminal-modified polymer, a graft-type polymer, and a block-type polymer, depending on its structure. The polymer dispersant is adsorbed on a surface of a pigment and acts so as to prevent re-aggregation. For this reason, examples of a preferred structure thereof include a terminal-modified polymer, a graft-type polymer, and a block-type polymer, which have an anchoring site on a surface of a pigment. In addition, the dispersants described in paragraph Nos. 0028 to 0124 of JP2011-070156A, or the dispersants described in JP2007-277514A are also preferably used, and the contents of the publications are incorporated herein by reference.

For the resin (dispersant), a graft copolymer can also be used. With regard to details of the graft copolymer, reference can be made to the description in paragraph Nos. 0025 to 0094 of JP2012-255128A, the contents of which are incorporated herein by reference. Specific examples of the graft copolymer include the resins described in paragraph Nos. 0072 to 0094 of JP2012-255128A, the contents of which are incorporated herein by reference.

Moreover, an oligoimine-based dispersant including a nitrogen atom in at least one of the main chain or the side chain can also be used as the resin (dispersant). As the oligoimine-based dispersant, a resin having a side chain including a repeating unit having a partial structure X having a functional group with a pKa of 14 or less and an oligomer chain or side chain Y having 40 to 10,000 atoms, and having a basic nitrogen atom in at least one of the main chain or the side chain is preferable. The basic nitrogen atom is not particularly limited as long as it is a nitrogen atom exhibiting basicity.

With regard to the oligoimine-based dispersant, reference can be made to the description in paragraph Nos. 0102 to 0174 of JP2012-255128A, the contents of which are incorporated herein by reference. Specific examples of the oligoimine-based dispersant include the resins described in paragraph Nos. 0168 to 0174 of JP2012-255128A.

The dispersant is also available as a commercially available product, and specific examples thereof include "DA-7301" manufactured by Kusumoto Chemicals, Ltd., "DISPERBYK-101 (polyamidamine phosphate), 107 (carboxylic acid ester), 110 (copolymer including an acid group), 111 (phosphoric acid-based dispersant), 130 (polyamide), 161, 162, 163, 164, 165, 166, and 170 (polymeric copolymers)", and "BYK-P104 and P105 (unsaturated high-molecular-weight polycarboxylic acid)" manufactured by BYK-Chemie, "EFKA 4047, and 4050 to 4165 (polyurethane-based), EFKA 4330 to 4340 (block copolymer), 4400 to 4402 (modified polyacrylate), 5010 (polyesteramide), 5765 (high-molecular-weight polycarboxylate), 6220 (fatty acid polyester), 6745 (phthalocyanine derivative), and 6750 (azo pigment derivative)" manufactured by EFKA, "AJISPER PB821, PB822, PB880, and PB881" manufactured by Ajinomoto Fine-Techno Co., Inc., "FLOWLEN TG-710 (urethane oligomer)" and "POLYFLOW No. 50E, No. 300 (acrylic copolymer)" manufactured by Kyoeisha Chemical Co., Ltd., "DISPARLON KS-860, 873SN, 874, and #2150 (aliphatic polyvalent carboxylic acid), #7004 (polyether ester), DA-703-50, DA-705, and DA-725" manufactured by Kusumoto Chemicals, Ltd., "DEMOL RN and N (naphthalenesulfonic acid/formalin polycondensate), MS, C, and SN-B (aromatic sulfonic acid/formalin polycondensate)" manufactured by Kao Corporation, "HOMOGENOL L-18 (polymeric polycarboxylic acid), EMULGEN 920, 930, 935, and 985 (polyoxyethylene nonyl phenyl ether), and ACETAMINE 86 (stearylamine acetate)" manufactured by Kao Corporation, "SOLSPERSE 5000 (phthalocyanine derivative), 22000 (azo pigment derivative), 13240 (polyesteramine), 3000, 12000, 17000, 20000, and 27000 (polymers having a functional portion in the terminal portion), and 24000, 28000, 32000, and 38500 (graft-type polymers)" manufactured by The Lubrizol Corporation, "NIKKOL T106 (polyoxyethylene sorbitan monooleate) and MYS-IEX (polyoxyethylene monostearate)" manufactured by Nikko Chemicals Co., Ltd., "HINOACT T-8000E" manufactured by Kawaken Fine Chemicals Co., Ltd., "Organosiloxane Polymer KP341" manufactured by Shin-Etsu Chemical Co., Ltd., "EFKA-46, EFKA-47, EFKA-47EA, EFKA POLYMER 100, EFKA POLYMER 400, EFKA POLYMER 401, and EFKA POLYMER 450" manufactured by MORISHITA SANGYO Corporation, "DISPERSE AID 6, DISPERSE AID 8, DISPERSE AID 15, and DISPERSE AID 9100" manufactured by SAN NOPCO Ltd., "ADEKA PLURONIC L31, F38, L42, L44, L61, L64, F68, L72, P95, F77, P84, F87, P94, L101, P103, F108, L121, and P-123" manufactured by ADEKA Corporation, and "IONET S-20" manufactured by Sanyo Chemical Industries, Ltd.

In addition, the resins described as the dispersant can also be used in applications other than those as dispersants. For example, the resins can also be used as a binder.

<<<Alkali-Soluble Resin>>>

The coloring composition of the embodiment of the present invention preferably contains an alkali-soluble resin as the resin. By incorporation of the alkali-soluble resin, the developability or a pattern forming property is improved. In addition, the alkali-soluble resin can also be used as a dispersant or a binder.

The alkali-soluble resin can be appropriately selected from resins having a group enhancing alkali solubility. Examples of the group enhancing alkali solubility (hereinafter also referred to as an acid group) include a carboxyl group, a phosphoric acid group, a sulfo group, and a phenolic hydroxyl group, and the group is preferably the carboxyl group. The alkali-soluble resin may have one kind or two or more kinds of the acid groups.

The weight-average molecular weight (Mw) of the alkali-soluble resin is preferably 5,000 to 100,000. Further, the number-average molecular weight (Mn) of the alkali-soluble resin is preferably 1,000 to 20,000.

As the alkali-soluble resin, from the viewpoint of heat resistance, a polyhydroxystyrene-based resin, a polysiloxane-based resin, an acrylic resin, an acrylamide-based resin, and an acryl/acrylamide copolymer resin are preferable. Further, from the viewpoint of controlling developability, an acrylic resin, an acrylamide-based resin, and an acryl/acrylamide copolymer resin are preferable.

As the alkali-soluble resin, a polymer having a carboxyl group in a side chain is preferable. Examples thereof include copolymers having a repeating unit derived from monomers such as methacrylic acid, acrylic acid, itaconic acid, crotonic acid, maleic acid, 2-carboxyethyl (meth)acrylic acid, vinylbenzoic acid, and a partially esterified maleic acid, an alkali-soluble phenol resin such as a novolac resin, an acidic cellulose derivative having a carboxyl group in a side chain, and a polymer obtained by adding an acid anhydride to a polymer having a hydroxyl group. In particular, a copolymer of a (meth)acrylic acid and another monomer copolymerizable with the (meth)acrylic acid is suitable as the alkali-soluble resin. Examples of another monomer copolymerizable with a (meth)acrylic acid include alkyl (meth)acrylate, aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, cyclohexyl (meth)acrylate, glycidyl methacrylate, and tetrahydrofurfuryl methacrylate. Examples of the vinyl compound include styrene, α-methylstyrene, vinyltoluene, acrylonitrile, vinyl acetate, N-vinylpyrrolidone, a polystyrene macromonomer, and a polymethyl methacrylate macromonomer. Further, examples of other monomer include the N-position-substituted maleimide monomers described in JP1998-300922A (JP-H10-300922A), such as N-phenylmaleimide and N-cyclohexylmaleimide. Such other monomers copolymerizable with (meth)acrylic acids may be of one kind or of two or more kinds thereof.

As the alkali-soluble resin, a benzyl (meth)acrylate/(meth)acrylic acid copolymer, benzyl (meth)acrylate/(meth)acrylic acid/2-hydroxyethyl (meth)acrylate copolymer, or a multicomponent copolymer including benzyl (meth)acrylate/(meth)acrylic acid/other monomers can be preferably used. Further, a copolymer obtained by copolymerizing 2-hydroxyethyl (meth)acrylate, a 2-hydroxypropyl (meth)acrylate/polystyrene macromonomer/benzyl methacrylate/methacrylic acid copolymer described in JP1995-140654A (JP-H07-140654A), a 2-hydroxy-3-phenoxypropylacrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, a 2-hydroxyethyl methacrylate/polystyrene macromonomer/benzyl methacrylate/methacrylic acid copolymer, and the like can also be preferably used. In addition, as a commercially available product thereof, for example, FF-426 (manufactured by Fujikura Kasei Co., Ltd.) or the like can also be used.

As the alkali-soluble resin, an alkali-soluble resin having a polymerizable group may be used. Examples of the polymerizable group include a (meth)allyl group and a (meth)acryloyl group. As the alkali-soluble resin having a polymerizable group, an alkali-soluble resin having a polymerizable group on a side chain thereof, and the like are useful. Examples of commercially available products of the alkali-soluble resin having a polymerizable group include DIANAL NR Series (manufactured by Mitsubishi Rayon Co., Ltd.), PHOTOMER 6173 (COOH-containing polyurethane acrylic oligomer, manufactured by Diamond Shamrock Co., Ltd.), VISCOAT R-264 and KS RESIST 106 (both manufactured by Osaka Organic Chemical Industry, Ltd.), CYCLOMER P Series (for example, ACA230AA) and PLACCEL CF200 Series (both manufactured by Daicel Corporation), EBECRYL 3800 (manufactured by Daicel-UCB Co., Ltd.), ACRYCURE RD-F8 (manufactured by Nippon Shokubai Co., Ltd.), and DP-1305 (manufactured by Fuji Fine Chemical Co., Ltd.).

It is also preferable that the alkali-soluble resin includes a polymer formed by polymerizing monomer components including at least one compound selected from a compound represented by Formula (ED1) and the compound represented by Formula (1) of JP2010-168539A (these compounds are hereinafter also referred to as an "ether dimer" in some cases).

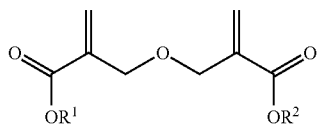

(ED1)

In Formula (ED1), $R^1$ and $R^2$ each independently represent a hydrogen atom or a hydrocarbon group having 1 to 25 carbon atoms, which may have a substituent.

With regard to specific examples of the ether dimer, reference can be made to paragraph No. 0317 of JP2013-029760A, the contents of which are incorporated herein by reference. These ether dimers may be of one kind or of two or more kinds.

Example of the polymer formed by polymerizing monomer components including ether dimers include the following structures.

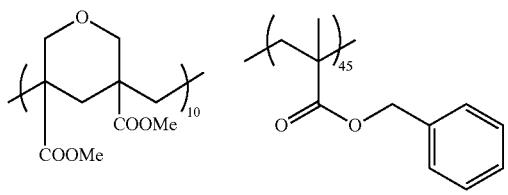

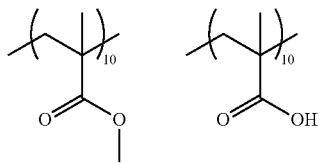

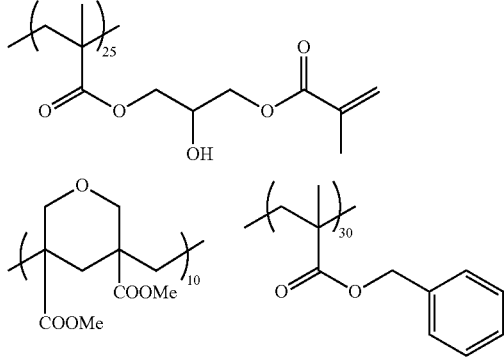

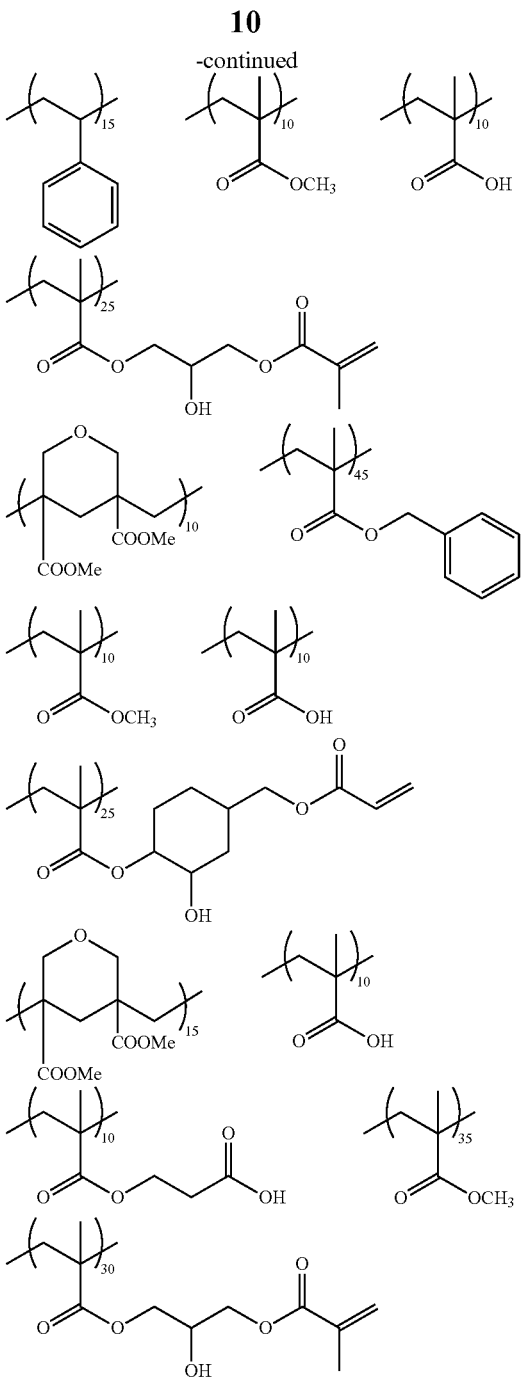

The alkali-soluble resin may include a repeating unit derived from a compound represented by Formula (X).

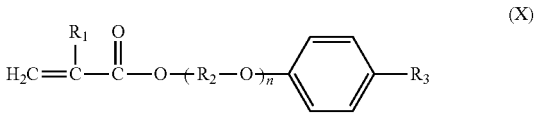

(X)

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms, which may include a benzene ring. n represents an integer of 1 to 15.

In Formula (X), the number of carbon atoms in the alkylene group of $R_2$ is preferably 2 or 3. Further, the number of carbon atoms in the alkyl group of $R_3$ is preferably 1 to 10, and the alkyl group of $R_3$ may include a benzene ring. Examples of the alkyl group including a benzene ring, represented by $R_3$, include a benzyl group and a 2-phenyl(iso)propyl group.

With regard to the alkali-soluble resin, reference can be made to the description in paragraph Nos. 0558 to 0571 of JP2012-208494A (paragraph Nos. 0685 to 0700 of the corresponding US2012/0235099A), the contents of which are incorporated herein by reference. In addition, the copolymers (B) described in paragraph Nos. 0029 to 0063 of JP2012-032767A and the alkali-soluble resins used in Examples of the document, the binder resins described in paragraph Nos. 0088 to 0098 of JP2012-208474A and the binder resins used in Examples of the document, the binder resins described in paragraph Nos. 0022 to 0032 of JP2012-137531A and the binder resins used in Examples of the document, the binder resins described in paragraph Nos. 0132 to 0143 of JP2013-024934A and Examples of the document, the binder resins described in paragraph Nos. 0092 to 0098 of JP2011-242752A and the binder resins used in Examples of the document, or the binder resins described in paragraph Nos. 0030 to 0072 of JP2012-032770A can be used, and the contents of these publications are incorporated herein by reference.

The acid value of the alkali-soluble resin is preferably 30 to 500 mgKOH/g. The lower limit is more preferably 50 mgKOH/g or more, and still more preferably 70 mgKOH/g or more. The upper limit is more preferably 400 mgKOH/g or less, still more preferably 200 mgKOH/g or less, even still more preferably 150 mgKOH/g or less, and further still more preferably 120 mgKOH/g or less.

The content of the alkali-soluble resin is preferably 1% to 80% by mass with respect to the total solid content of the coloring composition. The lower limit is more preferably 2% by mass or more, and still more preferably 3% by mass or more. The upper limit is more preferably 70% by mass or less, and still more preferably 60% by mass or less. The coloring composition of the embodiment of the present invention may include one kind or two or more kinds of the alkali-soluble resins. In a case where two or more kinds of the alkali-soluble resins are included, the total amount thereof preferably falls within the range.

<<<Other Resins>>>

The coloring composition of the embodiment of the present invention can contain resins (also referred to as other resins) other than the above-mentioned dispersants or alkali-soluble resins as the resin. Examples of such other resins include a (meth)acrylic resin, a (meth)acrylamide resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamideimide resin, a polyolefin resin, a cyclic olefin resin, polyester resin, a styrene resin, and a siloxane resin. These resins may be used singly or as a mixture of two or more kinds thereof.

<<Polymerizable Compound>>

The coloring composition of the embodiment of the present invention contains a polymerizable compound. As the polymerizable compound, a compound which is polymerizable with heat, light, or radicals can be used. Examples thereof include a radically polymerizable compound having a radically polymerizable group such as a group having an ethylenically unsaturated bond. Examples of the group having an ethylenically unsaturated bond include a vinyl group, a (meth)allyl group, and a (meth)acryloyl group. The polymerizable compound is preferably a radically polymerizable compound.

In the present invention, the polymerizable compound may be any one of chemical forms such as a monomer, a prepolymer, and an oligomer, but is preferably a monomer.

The molecular weight of the polymerizable compound is preferably 100 to 3,000. The upper limit is preferably 2,000 or less, and more preferably 1,500 or less. The lower limit is preferably 150 or more, and more preferably 250 or more.

The polymerizable compound is preferably a trifunctional to pentadecafunctional (meth)acrylate compound, and more preferably a trifunctional to hexafunctional (meth)acrylate compound. With regard to these specific examples, reference can be made to the compounds described in paragraph Nos. 0095 to 0108 of JP2009-288705A, paragraph No. 0227 of JP2013-029760A, and paragraph Nos. 0254 to 0257 of JP2008-292970A, the contents of which are incorporated herein by reference.

As the polymerizable compound, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd., A-DPH-12E manufactured by Shin-Nakamura Chemical Co., Ltd.), and a structure in which these (meth)acryloyl groups are bonded via an ethylene glycol or propylene glycol residue (for example, SR454 and SR499, commercially available from Sartomer Company, Inc.) are preferable. Oligomer types of these can also be used. In addition, KAYARAD RP-1040 and DPCA-20 (manufactured by Nippon Kayaku Co., Ltd.) can also be used as the polymerizable compound.

Furthermore, as the polymerizable compound, a trifunctional (meth)acrylate compound such as trimethylolpropane tri(meth)acrylate, trimethylolpropane propyleneoxy-modified tri(meth)acrylate, trimethylolpropane ethyleneoxy-modified tri(meth)acrylate, isocyanuric acid ethyleneoxy-modified tri(meth)acrylate, and pentaerythritol tri(meth) acrylate can also be preferably used. Examples of commercially available products of the trifunctional (meth) acrylate compound include ARONIX M-309, M-310, M-321, M-350, M-360, M-313, M-315, M-306, M-305, M-303, M-452, and M-450 (manufactured by Toagosei Chemical Industry Co., Ltd.), NKester A9300, A-GLY-9E, A-GLY-20E, A-TMM-3, A-TMM-3L, A-TMM-3LM-N, A-TMPT, and TMPT (manufactured by Shin-Nakamura Chemical Co., Ltd.), and KAYARAD GPO-303, TMPTA, THE-330, TPA-330, and PET-30 (manufactured by Nippon Kayaku Co., Ltd.).

In addition, the following compounds can also be used.

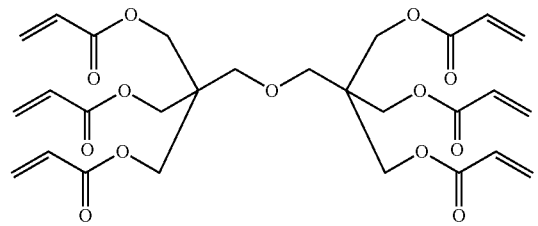

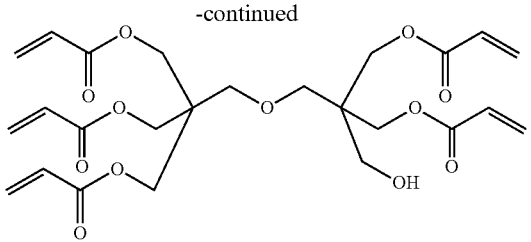

The polymerizable compound may have an acid group. By using the polymerizable compound having an acid group, the polymerizable compound in the unexposed area is easily removed during the development, and generation of development residues can be suppressed. Examples of the acid group include a carboxyl group, a sulfo group, and a phosphoric acid group, and the carboxyl group is preferable. Examples of the polymerizable compound having an acid group include the following compound. Examples of a commercially available product thereof include ARONIX M-510 and M-520 (manufactured by Toagosei Chemical Industry Co., Ltd.).

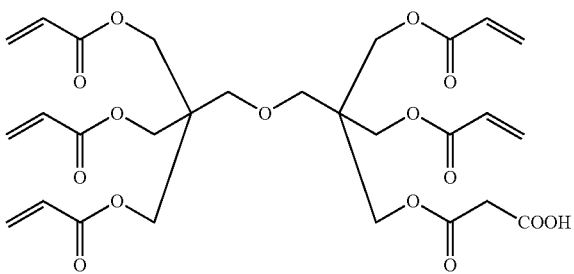 [SMILES: C=CC(=O)OCC(COCC(COC(=O)C=C)(COC(=O)C=C)COC(=O)CC(=O)O)(COC(=O)C=C)COC(=O)C=C]

The acid value of the polymerizable compound having an acid group is preferably 0.1 to 40 mgKOH/g, and more preferably 5 to 30 mgKOH/g. In a case where the acid value of the polymerizable compound is 0.1 mgKOH/g or more, the solubility with respect to the developer is good, whereas in a case where the acid value is 40 mgKOH/g or less, it is advantageous in production or handling. In addition, the photopolymerization performance is good and the curability is excellent.

In another preferred aspect, the polymerizable compound is a compound having a caprolactone structure. The polymerizable compound having a caprolactone structure is commercially available, for example, as KAYARAD DPCA series from Nippon Kayaku Co., Ltd., and examples thereof include DPCA-20, DPCA-30, DPCA-60, and DPCA-120.

As to the polymerizable compound, a polymerizable compound having an alkyleneoxy group can be used. The polymerizable compound having an alkyleneoxy group is preferably a polymerizable compound having an ethyleneoxy group and/or a propyleneoxy group, more preferably a polymerizable compound having an ethyleneoxy group, and still more preferably a trifunctional to hexafunctional (meth) acrylate compound having 4 to 20 ethyleneoxy groups. Specific examples of the polymerizable compound having an alkyleneoxy group include the following compound. Examples of the commercially available product of the polymerizable compound having an alkyleneoxy group include SR-494 which is a tetrafunctional (meth)acrylate having four ethyleneoxy groups, manufactured by Sartomer Co., Inc., and KAYARAD TPA-330 which is a trifunctional (meth)acrylate having three isobutyleneoxy groups, manufactured by Nippon Kayaku Co., Ltd.

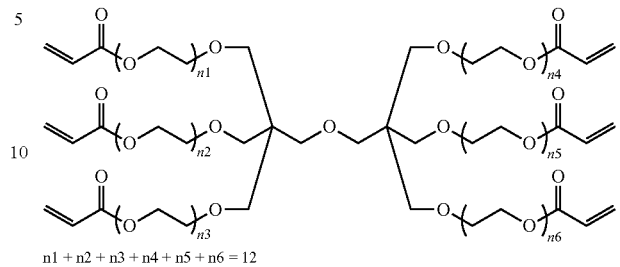

$n1 + n2 + n3 + n4 + n5 + n6 = 12$

As the polymerizable monomer, the urethane acrylates as described in JP1973-041708B (JP-S48-041708B), JP1976-037193A (JP-S51-037193A), JP1990-032293B (JP-H02-032293B), and JP1990-016765B (JP-H02-016765B), and the urethane compounds having an ethylene oxide-based skeleton described in JP1983-049860B (JP-S58-049860B), JP1981-017654B (JP-S56-017654B), JP1987-039417B (JP-S62-039417B), and JP1987-039418B (JP-S62-039418B) are also suitable. In addition, by using addition-polymerizable compounds, which have an amino structure or a sulfide structure in a molecule, and are described in JP1988-277653A (JP-S63-277653A), JP1988-260909A (JP-S63-260909A), and JP1989-105238A (JP-H01-105238A), as the polymerizable compounds, a coloring composition which is extremely excellent in photosensitization speed can be obtained.

Examples of a commercially available product thereof include urethane oligomers UAS-10 and UAB-140 (manufactured by Sanyo-kokusaku Pulp Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600, and AI-600 (manufactured by Kyoeisha Chemical Co., Ltd.).

The content of the polymerizable compound is preferably 0.1% to 50% by mass with respect to the total solid content of the coloring composition. The lower limit is more preferably 0.5% by mass or more, and still more preferably 1% by mass or more. The upper limit is more preferably 45% by mass or less, and still more preferably 40% by mass or less. The polymerizable compound may be used singly or in combination of two or more kinds thereof. In a case where the polymerizable compound is used in combination of two or more kinds thereof, the total amount thereof preferably falls within the range.

<<Photopolymerization Initiator>>

The coloring composition of the embodiment of the present invention contains a photopolymerization initiator. The photopolymerization initiator is not particularly limited as long as it has an ability of initiating polymerization of the polymerizable compound, and can be appropriately selected from known photopolymerization initiators. For example, a compound having photosensitivity for light rays in regions from ultraviolet rays to visible light is preferable. Further, the photopolymerization initiator may also be a compound that generates an action with a photoexcited sensitizer to produce active radicals.

Examples of such another photopolymerization initiator include halogenated hydrocarbon derivatives (for example, compounds having a triazine skeleton and compounds having an oxadiazole skeleton), acylphosphine compounds such as acylphosphine oxide, oxime compounds such as hexaaryl biimidazole, oxime derivatives, organic peroxides, thio compounds, ketone compounds, aromatic onium salts, ketoxime ethers, aminoacetophenone compounds, and hydroxyacetophenone compounds. Moreover, from the viewpoint of exposure sensitivity, as the photopolymerization initiator, a compound selected from the group consisting of a trihalomethyl triazine compound, a benzyl dimethyl ketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, a hydroxyacetophenone compound, an aminoacetophenone compound, a cyclopentadiene-benzene-iron complex and a salt thereof, a halomethyl oxadiazole compound, and a 3-aryl-substituted coumarin compound is preferable. With regard to specific examples of the photopolymerization initiator, reference can be made to the description in paragraph Nos. 0265 to 0268 of JP2013-029760A, the contents of which are incorporated herein by reference.

As the photopolymerization initiator, a hydroxyacetophenone compound, an aminoacetophenone compound, or an acylphosphine compound can also be suitably used. More specifically, for example, the aminoacetophenone compound described in JP1998-291969A (JP-H10-291969A), and the acylphosphine compound described in JP4225898B can also be used. Further, as the hydroxyacetophenone compound, IRGACURE-184, DAROCUR-1173, IRGACURE-500, IRGACURE-2959, and IRGACURE-127 (trade names: all manufactured by BASF) can be used. As the aminoacetophenone compound, IRGACURE-907, IRGACURE-369, and IRGACURE-379 (trade names: all manufactured by BASF) which are commercially available products can be used. As the aminoacetophenone compound, the compound described in JP2009-191179A, which has an absorption wavelength matching a light source at 365 nm, 405 nm, or the like, can also be used. In addition, as the acylphosphine compound, IRGACURE-819 or DAROCUR-TPO (trade names: both manufactured by BASF) which is commercially available product can be used.

More preferred examples of the photopolymerization initiator include an oxime compound. In a case where the coloring composition of the embodiment of the present invention is used for the manufacture of a color filter, it is necessary to form a fine pattern in a sharp shape, and it is thus important to obtain curability and perform development without a residue remaining in an unexposed area. From such a viewpoint, it is preferable to use the oxime compound as the photopolymerization initiator.

As the oxime compound, for example, the compounds described in JP2001-233842A, the compounds described in JP2000-080068A, and the compounds described in JP2006-342166A can be used. Specific examples of the oxime compound include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

As the oxime compound, the compounds described in J. C. S. Perkin II (1979), pp. 1653 to 1660, J. C. S. Perkin II (1979), pp. 156 to 162, Journal of Photopolymer Science and Technology (1995), pp. 202 to 232, each of the publications of JP2000-066385A, JP2000-080068A, JP2004-534797A, and JP2006-342166A, or the like can also be used. As a commercially available product of the oxime compound, IRGACURE-OXE01, IRGACURE-OXE02, IRGACURE-OXE03, and IRGACURE-OXE04 (all manufactured by BASF) are also suitably used. In addition, TRONLY TR-PBG-304, TRONLY TR-PBG-309, and TRONLY TR-PBG-305 (manufactured by CHANGZHOU TRONLY NEW ELECTRONIC MATERIALS CO., LTD.), or ADEKA ARKLS NCI-930 and ADEKA OPTOMER N-1919 (all manufactured by ADEKA Corporation, a photopolymerization initiator 2 described in JP2012-14052A) can also be used.

Moreover, as oxime compounds other than the above-described oxime compounds, the compounds described in JP2009-519904A in which oxime is linked to N of a carbazole ring, the compounds described in U.S. Pat. No. 7,626,957B in which a hetero-substituent is introduced into a benzophenone moiety, the compounds described in JP2010-15025A in which a nitro group is introduced into a dye site, the compounds described in US2009-0292039A, the ketoxime compounds described in WO2009/131189A, the compounds described in U.S. Pat. No. 7,556,910B, which contains a triazine skeleton and an oxime skeleton in the same molecule, the compound described in JP2009-221114A, which has a maximum absorption at 405 nm and has good sensitivity to a light source of g-rays, and the like may be used. Preferably, reference can be made to, for example, the descriptions in paragraph Nos. 0274 to 0306 of JP2013-029760A, the contents of which are incorporated herein by reference.

In the present invention, an oxime compound having a fluorene ring can also be used as the photopolymerization initiator. Specific examples of the oxime compound having a fluorene ring include the compounds described in JP2014-137466A, the contents of which are incorporated herein by reference.

In the present invention, an oxime compound having a benzofuran skeleton can also be used as the photopolymerization initiator. Specific examples thereof include the compounds OE-01 to OE-75 described in WO2015/036910A.

In the present invention, an oxime compound having a fluorine atom can also be used as the photopolymerization initiator. Specific examples of the oxime compound having a fluorine atom include the compounds described in JP2010-262028A, the compounds 24, and 36 to 40 described in JP2014-500852A, and the compounds (C-3) described in JP2013-164471A. The contents of the publications are incorporated herein by reference.

In the present invention, an oxime compound having a nitro group can also be used as the photopolymerization initiator. The oxime compound having a nitro group is also preferably used in the form of a dimer. Specific examples of the oxime compound having a nitro group include the compounds described in paragraph Nos. 0031 to 0047 of JP2013-114249A and paragraph Nos. 0008 to 0012 and 0070 to 0079 of JP2014-137466A, the compounds described in paragraph Nos. 0007 to 0025 of JP4223071B, and ADEKA ARKLS NCI-831 (manufactured by ADEKA Corporation).

Specific examples of the oxime compound which is preferably used in the present invention are shown below, but the present invention is not limited thereto.

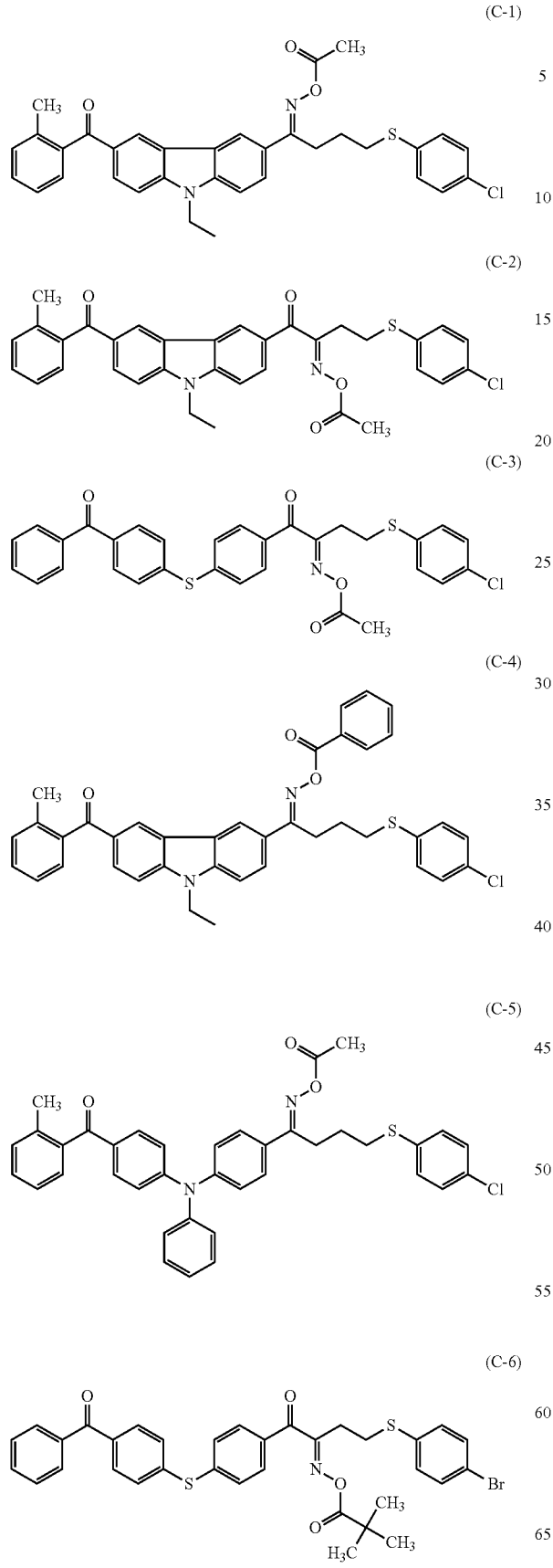
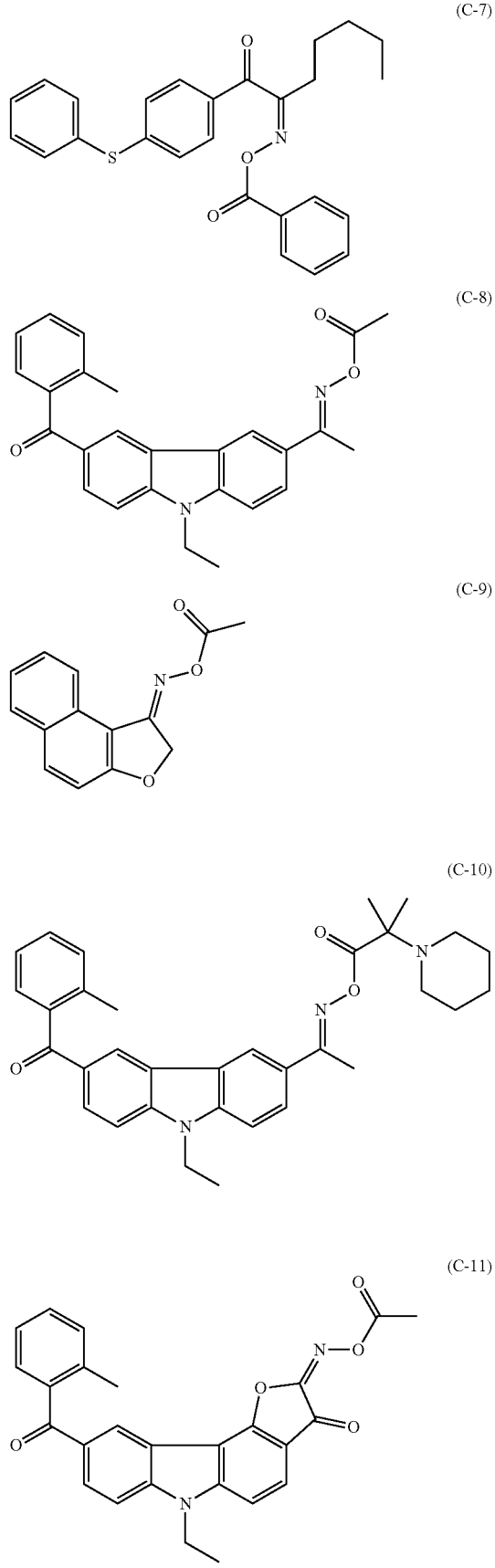

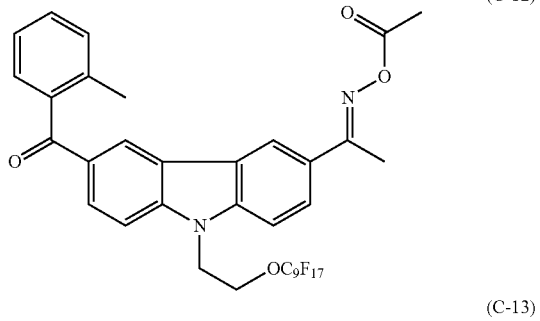
(C-12)

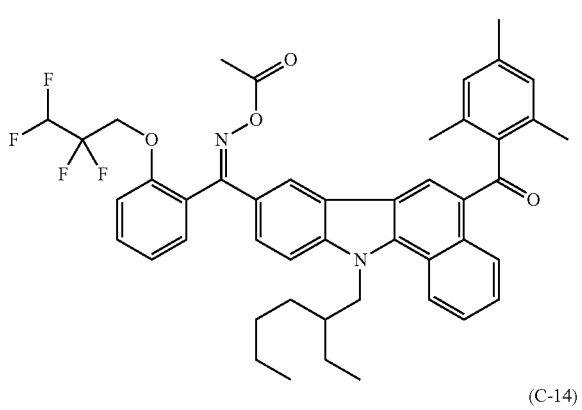
(C-13)

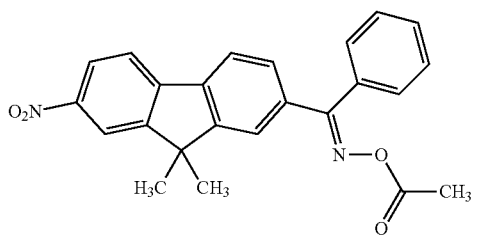
(C-14)

The oxime compound is the compound having a maximum absorption wavelength in a wavelength range of preferably 350 nm to 500 nm, more preferably the compound having a maximum absorption wavelength in a wavelength range of 360 nm to 480 nm, and particularly preferably the compound having a high absorbance at 365 nm and 405 nm.

From the viewpoint of sensitivity, the molar light absorption coefficient at 365 nm or 405 nm of the oxime compound is preferably 1,000 to 300,000, more preferably 2,000 to 300,000, and particularly preferably 5,000 to 200,000. The molar light absorption coefficient of the compound can be measured using a known method, and specifically, it is preferable to measure the molar light absorption coefficient by means of, for example, an ultraviolet and visible light spectrophotometer (Cary-5 spectrophotometer manufactured by Varian) by using an ethyl acetate solvent at a concentration of 0.01 g/L.

The content of the photopolymerization initiator is preferably 0.1% to 50% by mass, more preferably 0.5% to 30% by mass, and still more preferably 1% to 20% by mass, with respect to the total solid content of the coloring composition. In a case where the content of the photopolymerization initiator is within the range, good sensitivity and good pattern forming properties are obtained. The coloring composition of the embodiment of the present invention may include one kind or two or more kinds of the photopolymerization initiators. In a case where the photopolymerization initiators are used in combination of two or more kinds thereof, the total amount thereof preferably falls within the range.

<<Organic Solvent E>>

The coloring composition of the embodiment of the present invention contains an organic solvent E.

The organic solvent E includes an ester-based solvent E1 having a surface tension at 25° C. of from 25 mN/m to 35 mN/m and an organic solvent E2 having a surface tension at 25° C. of less than 25 mN/m. In the organic solvent E, a ratio of a mass of the ester-based solvent E1 to a mass of the organic solvent E2 is 80:20 to 30:70, preferably 70:30 to 35:65, and more preferably 60:40 to 40:60, in terms of the ratio of the mass of the ester-based solvent E1 to the mass of the organic solvent E2. By using the organic solvent E including the ester-based solvent E1 and the organic solvent E2 at the above-mentioned ratio, occurrence of striation can be effectively suppressed. Further, the drying property of the coloring composition is also good.

Furthermore, in the present invention, the surface tension of the organic solvent is a value measured by a plate method using a platinum plate. Here, the measurement of the surface tension by a plate method is as follows.

In a case where a measurement element (plate) is in contact with the surface of a liquid, the liquid is wetted for the plate. Here, a surface tension works along the periphery of the plate and tends to pull the plate into the liquid. This pulling force is read to measure the surface tension of the liquid. As a device for measuring the surface tension, a surface tensiometer CBVP-Z manufactured by Kyowa Interface Science Corporation can be used.

The surface tension at 25° C. of the ester-based solvent E1 is from 25 mN/m to 35 mN/m. The upper limit is preferably 34 mN/m or less, more preferably 30 mN/m or less, and still more preferably 28 mN/m or less. The lower limit is preferably 25.5 mN/m or more, more preferably 26 mN/m or more, and still more preferably 27 mN/m or more. In a case where the surface tension of the ester-based solvent E1 is within the range, the wettability of the coloring composition for the support, the drying property of the coloring composition, and the like are good.

A boiling point of the ester-based solvent E1 is preferably 140° C. to 180° C. The upper limit is more preferably 175° C. or lower, still more preferably 170° C. or lower, and even still more preferably 165° C. or lower. The lower limit is more preferably 143° C. or higher, and still more preferably 145° C. or higher. In a case where the boiling point of the ester-based solvent E1 is within the range, the drying property of the coloring composition is good.

In addition, the boiling point of the ester-based solvent E1 is preferably higher than a boiling point of the organic solvent E2, more preferably higher than, the boiling point of the organic solvent E2 by 5° C. or higher, and still more preferably higher than the boiling point of the organic solvent E2 by 10° C. or higher. According to this aspect, occurrence of striation can be more effectively suppressed.

The ester-based solvent E1 has a solubility in 100 g of water at 25° C. of preferably 30 g or less, more preferably 25 g or less, and still more preferably 20 g or less. By using an organic solvent having a small solubility in water as the ester-based solvent E1, it is possible to increase the solubility of other components used in the coloring composition, and the like.

Moreover, in the present invention, the ester-based solvent E1 means a compound (organic solvent) having an ester bond. In the present invention, the ester-based solvent E1 is preferably a compound (organic solvent) having an ether bond and an ester bond.

Specific examples of the ester-based solvent E1 include propylene glycol monomethyl ether acetate, propylene glycol monoethyl ether acetate, ethyl 3-ethoxypropionate, and ethyl lactate. Among those, from the viewpoints of the solubility, the easy handling, and the like of the materials included in the coloring composition, propylene glycol monomethyl ether acetate, propylene glycol monoethyl ether acetate, and ethyl 3-ethoxypropionate are preferable.

The content of the ester-based solvent E1 in the total mass of the organic solvent E is preferably 15% by mass or more. The lower limit of the content is more preferably 20% by mass or more, still more preferably 25% by mass or more, and even still preferably 30% by mass or more. The upper limit of the content is preferably 90% by mass or less, more preferably 85% by mass or less, and still more preferably 80% by mass or less.

The surface tension at 25° C. of the organic solvent E2 is less than 25 mN/m. The upper limit is preferably 24.8 mN/m or less, more preferably 24.6 mN/m or less and still more preferably 24.4 mN/m or less. The lower limit is preferably 20 mN/m or more, more preferably 21 mN/m or more, and still more preferably 22 mN/m or more. In a case where the surface tension of the organic solvent E2 is within the range, the wettability of the coloring composition for the support, the drying property of the coloring composition, and the like are good.

The boiling point of the organic solvent E2 is preferably 50° C. to 135° C. The upper limit is more preferably 133° C. or lower, still more preferably 130° C. or lower, and even still more preferably 127° C. or lower. The lower limit is more preferably 70° C. or higher, still more preferably 90° C. or higher, and even still more preferably 110° C. or higher.

The organic solvent E2 has a solubility in 100 g of water at 25° C. of preferably 30 g or less, more preferably 10 g or less, and still more preferably 5 g or less. By using an organic solvent having a small solubility in water as the organic solvent E2, it is possible to increase the solubility of other components used in the coloring composition, and the like. In addition, incorporation of the moisture into the coloring composition can be suppressed, and deterioration of temporal stability caused by water can thus be suppressed.

The organic solvent E2 is preferably a compound (organic solvent) having an ester bond. The organic solvent E2 is preferably a compound (organic solvent) having no ether bond, and more preferably a compound (organic solvent) having an ester bond but having no ether bond. The organic solvent E2 is preferably a compound (organic solvent) represented by Formula (E2-1).

$R^{e1}$—C(=O)—O—$R^{e2}$         (E2-1)

In the formula, $R^{e1}$ and $R^{e2}$ each independently represent a hydrocarbon group.

The hydrocarbon group in $R^{e1}$ and $R^{e2}$ is a group formed of only carbon atoms and hydrogen atoms. Specific examples of the hydrocarbon group represented by $R^{e1}$ and $R^{e2}$ include an alkyl group, an alkenyl group, an alkynyl group, and an aryl group, and the hydrocarbon group is preferably the alkyl group, the alkenyl group, or the alkynyl group, and more preferably the alkyl group.

The number of carbon atoms of the alkyl group is preferably 1 to 10, and more preferably 1 to 5. The alkyl group may be linear, branched, or cyclic, and is preferably linear or branched, and more preferably linear. The alkyl group is preferably an unsubstituted alkyl group.

The number of carbon atoms of the alkenyl group is preferably 2 to 10, and more preferably 2 to 5. The alkenyl group is preferably linear or branched, and more preferably linear. The alkenyl group is preferably an unsubstituted alkenyl group.

The number of carbon atoms of the alkynyl group is preferably 2 to 10, and more preferably 2 to 5. The alkynyl group is preferably linear or branched, and more preferably linear. The alkynyl group is preferably an unsubstituted alkynyl group.

The number of carbon atoms of the aryl group is preferably is preferably 6 to 20, and more preferably 6 to 12. The aryl group may be an unsubstituted aryl group, and may also have an alkyl group, an alkenyl group, or an alkanyl group as a substituent.

Specific examples of the organic solvent E2 include methyl acetate, ethyl acetate, propyl acetate, isopropyl acetate, butyl acetate, ethyl butyrate, and ethyl propionate, and the organic solvent E2 is preferably methyl acetate, ethyl acetate, propyl acetate, isopropyl acetate, or butyl acetate, more preferably propyl acetate, isopropyl acetate, or butyl acetate, and still more preferably butyl acetate.

The content of the organic solvent E2 in the total mass of the organic solvent E is preferably 10% by mass or more. The lower limit is more preferably 20% by mass or more, still more preferably 30% by mass or more, and even still more preferably 40% by mass or more. The upper limit is preferably 90% by mass or less, more preferably 80% by mass or less, and still more preferably 70% by mass or less.

The total content of the ester-based solvent E1 and the organic solvent E2 in the total mass of the organic solvent E is 50% by mass or more. The lower limit is preferably 55% by mass or more, more preferably 60% by mass or more, and still more preferably 65% by mass or more. The upper limit is preferably 95% by mass or less, more preferably 90% by mass or less, and still more preferably 85% by mass or less.

The organic solvent E used in the present invention may include an organic solvent other than the above-mentioned ester-based solvent E1 and organic solvent E2. Examples thereof include a ketone-based solvent E3 and an ether-based solvent E4. It is preferable that the organic solvent E further includes the ketone-based solvent E3. By further incorporating the ketone-based solvent E3 into the organic solvent E, the solubility of the materials included in the coloring composition can be improved.

Examples of the ketone-based solvent E3 include a ketone compound having a surface tension at 25° C. of 25 mN/m or more, which has no ester bond. Specific examples thereof include methyl ethyl ketone, cyclohexanone, cyclopentanone, 2-heptanone, and 3-heptanone. Examples of the ether-based solvent E4 include an ether compound having a surface tension at 25° C. of 25 mN/m or more, which has no ester bond. Specific examples thereof include diethylene glycol monomethyl ether, diethylene glycol monoethyl ether, diethylene glycol dimethyl ether, tetrahydrofuran, ethylene glycol monomethyl ether, ethylene glycol monoethyl ether, diethylene glycol monobutyl ether, propylene glycol monomethyl ether, propylene glycol monoethyl ether, propylene glycol mono-n-propyl ether, propylene glycol mono-n-butyl ether, and dipropylene glycol dimethyl ether.

In a case where the organic solvent E includes the ketone-based solvent E3, the content of the ketone-based solvent E3 is preferably 1% by mass or more. The lower limit is more preferably 5% by mass or more, still more preferably 10% by mass or more, and even still more preferably 15% by mass or more. The upper limit is preferably 50% by mass or less, more preferably 40% by mass or less, and still more preferably 30% by mass or less.

In a case where the organic solvent E includes the ether-based solvent E4, the content of the ether-based solvent E4 is preferably 1% by mass or more. The lower limit is more preferably 5% by mass or more, still more preferably 10% by mass or more, and still more preferably 15% by mass or more. The upper limit is preferably 50% by mass or less, more preferably 40% by mass or less, and still more preferably 30% by mass or less.

The surface tension at 25° C. of the organic solvent E used in the present invention is preferably from 22 mN/m to 29 mN/m. The upper limit is more preferably 27.5 mN/m or less, still more preferably 27.2 mN/m or less, and even still more preferably 27.0 mN/m or less. The lower limit is more preferably 24 mN/m or more, still more preferably 24.5 mN/m or more, and even still more preferably 25.0 mN/m or more.

In addition, the surface tension of the organic solvent E is a value of the surface tension in a mixed liquid of two or more solvents including at least the above-mentioned ester-based solvent E1 and organic solvent E2, and is defined as the following formula.

$$\sum_{i=1}^{n}(A_i \times \gamma_i)$$

In the formula, $\gamma_i$ is a value (unit: mN/m) of the surface tension of the organic solvent $E_i$ included in the organic solvent E, and $A_i$ is a mass proportion of the organic solvent $E_i$ included in the organic solvent E. n is an integer of 2 or more.

In the present invention, the organic solvent E preferably has a content of peroxides of 0.8 mmol/L or less, and more preferably, it does not substantially include peroxides. Further, it is preferable to use an organic solvent having a small metal content, and for example, the metal content of the organic solvent is preferably 10 ppb by mass or less. The metal content of the organic solvent is at a level of ppt by mass, as desired, and such a high-purity solvent is provided by, for example, Toyo Kasei Kogyo Co., Ltd. (The Chemical Daily, Nov. 13, 2015).

The coloring composition of the embodiment of the present invention preferably includes 40% to 95% by mass of the organic solvent E. The lower limit of the content is more preferably 45% by mass or more, still more preferably 50% by mass or more, and even still more preferably 60% by mass or more. The upper limit of the content is more preferably 90% by mass or less, still more preferably 85% by mass or less, and even still more preferably 80% by mass or less.

The coloring composition of the present embodiment of the invention preferably includes 40% by mass or more of a combination of the ester-based solvent E1 and the organic solvent E2. The lower limit of the content is more preferably 45% by mass or more, still more preferably 50% by mass or more, and even still more preferably 60% by mass or more. The upper limit of the content is preferably 90% by mass or less, more preferably 85% by mass or less, and still more preferably 80% by mass or less.

<<Compound Having Epoxy Group>>

The coloring composition of the embodiment of the present invention can include a compound having an epoxy group (hereinafter also referred to as an epoxy compound). The epoxy compound preferably has 1 to 100 epoxy groups per molecule. The lower limit is more preferably 2 or more. The upper limit can be set to, for example, 10 or less, or to 5 or less.

The epoxy equivalent (=the molecular weight of the epoxy compound/the number of epoxy groups) of the epoxy compound is preferably 500 g/equivalent or less, more preferably 100 to 400 g/equivalent, and still more preferably 100 to 300 g/equivalent.

The epoxy compound may be either a low-molecular-weight compound (for example, a molecular weight of less than 1,000) or a polymer compound (macromolecule) (for example, a molecular weight of 1,000 or more, and in a case of a polymer, a weight-average molecular weight of 1,000 or more). The weight-average molecular weight of the epoxy compound is preferably 200 to 100,000, and more preferably 500 to 50,000. The upper limit of the weight-average molecular weight is more preferably 10,000 or less, still more preferably 5,000 or less, and even still more preferably 3,000 or less.

As the epoxy compound, the compounds described in paragraph Nos. 0034 to 0036 of JP2013-011869A, paragraph Nos. 0147 to 0156 of JP2014-043556A, and paragraph Nos. 0085 to 0092 of JP2014-089408A can also be used. The contents of the publications are incorporated herein by reference. Examples of commercially available products thereof are as follows. Examples of a bisphenol A type epoxy resin jER825, jER827, jER828, jER834, jER1001, jER1002, jER1003, jER1055, jER1007, jER1009, and jER1010 (all manufactured by Mitsubishi Chemical Corporation), EPICLON860, EPICLON1050, EPICLON1051, and EPICLON1055 (all manufactured by DIC Corporation). Examples of a bisphenol F type epoxy resin include jER806, jER807, jER4004, jER4005, jER4007, and jER4010 (all manufactured by Mitsubishi Chemical Corporation), EPICLON830 and EPICLON835 (both manufactured by DIC Corporation), LCE-21 and RE-602S (both manufactured by Nippon Kayaku Co., Ltd.). Examples of a phenol novolac type epoxy resin include jER152, jER154, jER157S70, and jER157S65 (all manufactured by Mitsubishi Chemical Corporation), EPICLON N-740, EPICLON N-770, and EPICLON N-775 (all manufactured by DIC Corporation). Examples of a cresol novolac type epoxy resin include EPICLON N-660, EPICLON N-665, EPICLON N-670, EPICLON N-673, EPICLON N-680, EPICLON N-690, and EPICLON N-695 (all manufactured by DIC Corporation), and EOCN-1020 (all manufactured by Nippon Kayaku Co., Ltd.). Examples of an aliphatic epoxy resin include ADEKA RESIN EP-4080S, ADEKA RESIN EP-4085S, and ADEKA RESIN EP-4088S (all manufactured by ADEKA Corporation), CELLOXIDE 2021P, CELLOXIDE 2081, CELLOXIDE 2083, CELLOXIDE 2085, EHPE 3150, EPOLEAD PB 3600, and EPOLEAD PB 4700 (all manufactured by Daicel Chemical Industries, Ltd.), and DENACOL EX-212L, EX-214L, EX-216L, EX-321L, and EX-850L (all manufactured by Nagase ChemteX Corporation). In addition, other examples of the commercially available products include ADEKA RESIN EP-4000S, EP-4003S, EP-4010S, and EP-4011S (all manufactured by ADEKA Corporation), NC-2000, NC-3000, NC-7300, XD-1000, EPPN-501, and EPPN-502 (all manufactured by ADEKA Corporation), and jER1031S (manufactured by Mitsubishi Chemical Corporation).

Moreover, a compound represented by Formula (EP1) can also be used as the epoxy compound.

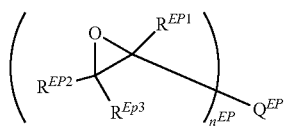
(EP1)

In Formula (EP1), $R^{EP1}$ to $R^{EP3}$ each independently represent a hydrogen atom, a halogen atom, or an alkyl group. The alkyl group may be linear, branched, or cyclic. Further, the alkyl group may be unsubstituted or may have a substituent. $R^{EP1}$ and $R^{EP2}$, or $R^{EP2}$ and $R^{EP3}$ may be bonded with each other to form a ring. $Q^{EP}$ represents a single bond or a $n^{EP}$-valent organic group. $R^{EP1}$ to $R^{EP3}$ may also be bonded to $Q^{EP}$ to form a ring. $n^{EP}$ represents an integer of 1 or more, and is preferably 2 to 10, and more preferably 2 to 6, provided that in a case where $Q^{EP}$ is a single bond, $n^{EP}$ is 2. With reference to the details of $R^{EP1}$ to $R^{EP3}$, or $Q^{EP}$, reference can be made to the description in paragraph Nos. 0087 to 0088 of JP2014-089408A, the contents of which are incorporated herein by reference. Specific examples of the compound represented by Formula (EP1) include glycidyl trityl ether. Other examples thereof include the compounds described in paragraph No. 0090 of JP2014-089408A, the contents of which are incorporated herein by reference.

In a case where the coloring composition of the embodiment of the present invention contains an epoxy compound, the content of the epoxy compound is preferably 0.1% to 40% by mass with respect to the total solid content of the coloring composition. The lower limit is, for example, preferably 0.5% by mass or more, and more preferably 1% by mass or more. The upper limit is, for example, more preferably 30% by mass or less, and still more preferably 20% by mass or less. The epoxy compounds may be used singly or in combination of two or more kinds thereof. In a case where two or more kinds of the epoxy compounds are used in combination, the total amount thereof preferably falls within the range.

<<Curing Accelerator>>

The coloring composition of the embodiment of the present invention may include a curing accelerator for the purpose of enhancing the hardness of a pattern or lowering a curing temperature. Examples of the curing accelerator include a thiol compound.

Examples of the thiol compound include a polyfunctional thiol compound having two or more mercapto groups in a molecule thereof. The polyfunctional thiol compound may also be added for the purpose of improving stability, odor, resolution, developability, adhesiveness, or the like. The polyfunctional thiol compounds are preferably secondary alkanethiols, and particularly preferably compounds having structures represented by Formula (T1).

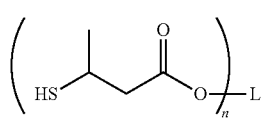
Formula (T1)

(In Formula (T1), n represents an integer of 2 to 4 and L represents a divalent to tetravalent linking group.)

In Formula (T1), it is preferable that L is an aliphatic group having 2 to 12 carbon atoms. In Formula (T1), it is more preferable that n is 2 and L is an alkylene group having 2 to 12 carbon atoms. Specific examples of the polyfunctional thiol compound include compounds represented by Structural Formulae (T2) to (T4), and the polyfunctional thiol compound is preferably the compound represented by Formula (T2). The thiol compounds can be used singly or in combination of a plurality of kinds thereof.

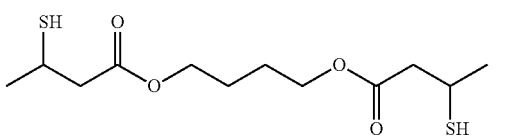
(T2)

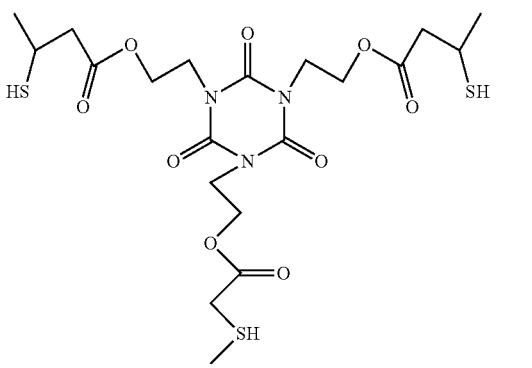
(T3)

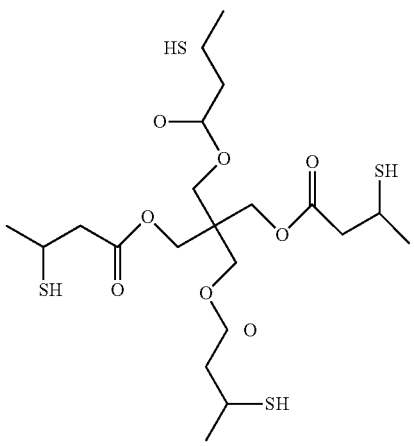
(T4)

Moreover, as the curing accelerator, a methylol-based compound (for example, the compounds exemplified as a crosslinking agent in paragraph No. 0246 of JP2015-034963A), amines, phosphonium salts, amidine salts, amide compounds (each of which are the curing agents described in, for example, paragraph No. 0186 of JP2013-041165A), base generators (for example, the ionic compounds described in JP2014-055114A), cyanate compounds (for example, the compounds described in paragraph No. 0071 of JP2012-150180A), alkoxysilane compounds (for example, the alkoxysilane compounds having an epoxy group described in JP2011-253054A), onium salt compounds (for example, the compounds exemplified as an acid generator in paragraph No. 0216 of JP2015-034963A, and the compounds described in JP2009-180949A), or the like can also be used.

In a case where the coloring composition of the embodiment of the present invention contains the curing accelerator, the content of the curing accelerator is preferably 0.3% to 8.9% by mass, and more preferably 0.8% to 6.4% by mass, with respect to the total solid content of the coloring composition.

<<Pigment Derivative>>

The coloring composition of the embodiment of the present invention preferably contains a pigment derivative. Examples of the pigment derivative include a compound having a structure in which a portion of the chromophore is substituted with an acidic group, a basic group, or a phthalimidomethyl group.

Examples of the chromophore constituting the pigment derivative include a quinoline-based skeleton, a benzimidazolone-based skeleton, a diketopyrrolopyrrole-based skeleton, an azo-based skeleton, a phthalocyanine-based skeleton, an anthraquinone-based skeleton, a quinacridone-based skeleton, a dioxazine-based skeleton, a perinone-based skeleton, a perylene-based skeleton, a thioindigo-based skeleton, an isoindoline-based skeleton, an isoindolinone-based skeleton, a quinophthalone-based skeleton, a threne-based skeleton, and a metal complex-based skeleton, and the chromophore is preferably the quinoline-based skeleton, the benzimidazolone-based skeleton, the diketopyrrolopyrrole-based skeleton, the azo-based skeleton, the quinophthalone-based skeleton, the isoindoline-based skeleton, or the phthalocyanine-based skeleton, and more preferably the azo-based skeleton or the benzimidazolone-based skeleton. As the acidic group contained in the pigment derivative, a sulfo group or a carboxyl group is preferable, and the sulfo group is more preferable. As the basic group contained in the pigment derivative, an amino group is preferable, and a tertiary amino group is more preferable. With regard to the specific examples of the pigment derivative, reference can be made to the description in paragraph Nos. 0162 to 0183 of JP2011-252065A, the contents of which are incorporated herein by reference.

In a case where the coloring composition of the embodiment of the present invention contains the pigment derivative, the content of the pigment derivative is preferably 1% to 30% by mass, and more preferably 3% to 20% by mass, with respect to the total mass of the pigment. The pigment derivative may be used singly or in combination of two or more kinds thereof.

<<Surfactant>>

From the viewpoint of further improving coatability, the coloring composition of the embodiment of the present invention may contain various surfactants. As the surfactant, various surfactants such as a fluorine-based surfactant, a nonionic surfactant, a cationic surfactant, an anionic surfactant, and a silicon-based surfactant can be used.

By incorporating a fluorine-based surfactant into the coloring composition of the embodiment of the present invention, liquid characteristics (in particular, fluidity) in a case of preparation of a coating liquid using the coloring composition are further improved, and thus, the evenness of coating thickness or liquid saving properties can be further improved. That is, in a case where a film is formed using the coating liquid to which a coloring composition containing a fluorine-based surfactant has been applied, the interface tension between a surface to be coated and the coating liquid is reduced to improve the wettability with respect to the surface to be coated, and enhance the coatability with respect to the surface to be coated. Therefore, a film with a uniform thickness which exhibits a small thickness deviation can be more suitably formed.

The fluorine content in the fluorine-based surfactant is preferably 3% to 40% by mass, more preferably 5% to 30% by mass, and particularly preferably 7% to 25% by mass. The fluorine-based surfactant in which the fluorine content falls within this range is effective in terms of the evenness of the thickness of the coating film, liquid saving properties, and the like, and the solubility of the surfactant in the coloring composition is also good.

Examples of the fluorine-based surfactant include MEGAFACE F171, F172, F173, F176, F177, F141, F142, F143, F144, R30, F437, F475, F479, F482, F554, and F780 (all manufactured by DIC Corporation), FLUORAD FC430, FC431, and FC171 (all manufactured by Sumitomo 3M), SURFLON S-382, SC-101, SC-103, SC-104, SC-105, SC-1068, SC-381, SC-383, and S393, and SURFLON KH-40 (all manufactured by Asahi Glass Co., Ltd.), and PF636, PF656, PF6320, PF6520, and PF7002 (all manufactured by OMNOVA). Further, as the fluorine-based surfactant, the compounds described in paragraph Nos. 0015 to 0158 of JP2015-117327A, and the compounds described in paragraph Nos. 0117 to 0132 of JP2011-132503A can be used. As the fluorine-based surfactant, a block polymer can also be used, and specific examples thereof include the compounds described in JP2011-089090A.

In addition, as the fluorine-based surfactant, an acrylic compound in which by application of heat to a molecular structure containing a functional group having a fluorine atom, in which the functional group containing a fluorine atom is cut to volatilize a fluorine atom, can also be preferably used. Examples of the fluorine-based surfactant include MEGAFACE DS series (manufactured by DIC Corporation, The Chemical Daily, Feb. 22, 2016, Nikkei Business Daily, Feb. 23, 2016), for example, MEGAFACE DS-21.

As the fluorine-based surfactant, a fluorine-containing polymer compound including a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups) can also be preferably used, and the following compounds are also exemplified as a fluorine-based surfactant for use in the present invention. In the following in the formula, % representing the ratio of the repeating unit is % by mass.

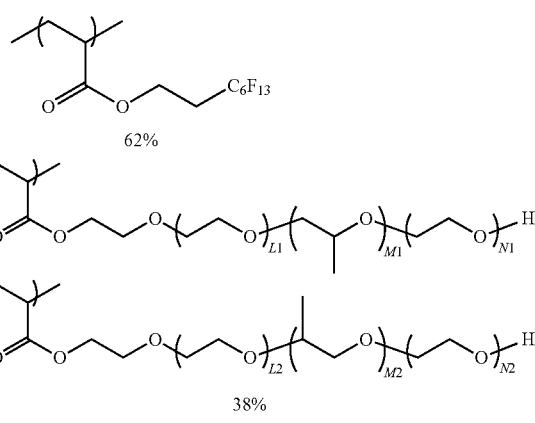

$L1 + N1 + L2 + N2 = 14$
$M1 + M2 = 17$

The weight-average molecular weight of the compounds is preferably 3,000 to 50,000, and is, for example, 14,000.

A fluorine-containing polymer having an ethylenically unsaturated bond in a side chain can also be used as the fluorine-based surfactant. Specific examples thereof include the compounds described in paragraph Nos. 0050 to 0090 and paragraph Nos. 0289 to 0295 of JP2010-164965A. Examples of commercially available products thereof include MEGAFACE RS-101, RS-102, RS-718-K, and RS-72-K, all of which are manufactured by DIC Corporation.

Examples of the nonionic surfactant include glycerol, trimethylolpropane, trimethylolethane, and ethoxylate and propoxylate thereof (for example, glycerol propoxylate and glycerol ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters, PLURONIC L10, L31, L61, L62, 10R5, 17R2, and 25R2 (manufactured by BASF), TETRONIC 304, 701, 704, 901, 904, and 150R1 (manufactured by BASF), SOLSEPERSE 20000 (manufactured by Lubrizol Japan Ltd.), NCW-101, NCW-1001, and NCW-1002 (manufactured by Wako Pure Chemical Industries, Ltd.), PIONIN D-6112, D-6112-W, and D-6315 (manufactured by Takemoto Oil & Fat Co., Ltd.), and OLFINE E1010, and SURFYNOL 104, 400, and 440 (manufactured by Nissin chemical industry Co., Ltd.).

Specific examples of the cationic surfactant include an organosiloxane polymer KP341 (manufactured by Shin-Etsu Chemical Co., Ltd.), a (meth)acrylic acid-based (co)polymer POLYFLOW No. 75, No. 90, and No. 95 (manufactured by KYOEISHA CHEMICAL CO., LTD.), and W001 (manufactured by Yusho Co., Ltd.).

Specific examples of the anionic surfactant include W004, W005, and W017 (manufactured by Yusho Co., Ltd.), and BL (manufactured by Sanyo Chemical Industries, Ltd.).

Examples of the silicon-based surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all manufactured by Dow Corning Toray Co., Ltd.), TSF-4440, TSF-4300, TSF-4445, TSF-4460, and TSF-4452 (all manufactured by Momentive Performance Materials Co., Ltd.), KP341, KF6001, and KF6002 (all manufactured by Shin-Etsu Chemical Co., Ltd.), and BYK307, BYK323, and BYK330 (all manufactured by BYK Chemie).

The surfactants may be used singly or in combination of two or more kinds thereof.

The content of the surfactant is preferably 0.001% to 2.0% by mass, and more preferably 0.005% to 1.0% by mass, with respect to the total solid content of the coloring composition.

<<Silane Coupling Agent>>

The coloring composition of the embodiment of the present invention can contain a silane coupling agent. In the present invention, the silane coupling agent means a silane compound having a hydrolyzable group and other functional groups. Further, the hydrolyzable group refers to a substituent that can be directly linked to a silicon atom to generate a siloxane bond by a hydrolysis reaction and/or a condensation reaction. Examples of the hydrolyzable group include a halogen atom, an alkoxy group, and an acyloxy group.

The silane coupling agent is preferably a silane compound having at least one selected from a vinyl group, an epoxy group, a styryl group, a methacryl group, an amino group, an isocyanurate group, a ureido group, a mercapto group, a sulfide group, and an isocyanate group, and an alkoxy group. Specific examples of the silane coupling agent include N-β-aminoethyl-γ-aminopropyl methyldimethoxysilane (KBM-602, manufactured by Shin-Etsu Chemical Co., Ltd.), N-β-aminoethyl-γ-aminopropyl trimethoxysilane (KBM-603, manufactured by Shin-Etsu Chemical Co., Ltd.), N-β-aminoethyl-γ-aminopropyl triethoxysilane (KBE-602, manufactured by Shin-Etsu Chemical Co., Ltd.), γ-aminopropyl trimethoxysilane (KBM-903, manufactured by Shin-Etsu Chemical Co., Ltd.), γ-aminopropyl triethoxysilane (KBE-903, manufactured by Shin-Etsu Chemical Co., Ltd.), 3-methacryloxypropyl trimethoxysilane (KBM-503, manufactured by Shin-Etsu Chemical Co., Ltd.), and 3-glycidoxypropyl trimethoxysilane (KBM-403, manufactured by Shin-Etsu Chemical Co., Ltd.). With regard to the details of the silane coupling agent, reference can be made to the description in paragraph Nos. 0155 to 0158 of JP2013-254047A, the contents of which are incorporated herein by reference.

In a case where the coloring composition of the embodiment of the present invention contains a silane coupling agent, the content of the silane coupling agent is preferably 0.001% to 20% by mass, more preferably 0.01% to 10% by mass, and particularly preferably 0.1% to 5% by mass, with respect to the total solid content of the coloring composition. The coloring composition of the embodiment of the present invention may include one kind or two or more kinds of the silane coupling agents. In a case where two or more kinds of the silane coupling agents are included, the total amount thereof preferably falls within the range.

<<Polymerization Inhibitor>>

It is also preferable that to the coloring composition of the embodiment of the present invention contains a polymerization inhibitor. Examples of the polymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), and a N-nitrosophenylhydroxylamine salt (an ammonium salt, a cerous salt, and the like).

In a case where the coloring composition of the embodiment of the present invention contains a polymerization inhibitor, the content of the polymerization inhibitor is preferably 0.01% to 5% by mass with respect to the total solid content of the coloring composition. The coloring composition of the embodiment of the present invention may include one kind or two or more kinds of the polymerization inhibitor. In a case where two or more kinds of the polymerization inhibitors are included, the total amount thereof preferably falls within the range.

<<Ultraviolet Absorber>>

The coloring composition of the embodiment of the present invention may contain an ultraviolet absorber. As the ultraviolet absorber, a conjugated diene-based compound is preferable. Examples of commercially available products of the ultraviolet absorber include UV-503 (manufactured by Daito Chemical Co., Ltd.). Further, as the ultraviolet absorber, an aminodiene compound, a salicylate compound, a benzophenone compound, a benzotriazole compound, an acrylonitrile compound, a triazine compound, or the like can be used. Specific examples thereof include the compounds described in JP2013-068814A. In addition, as the benzotriazole compound, MYUA series manufactured by Miyoshi Oil & Fat Co., Ltd. (The Chemical Daily, Feb. 1, 2016) may be used.

In a case where the coloring composition of the embodiment of the present invention contains an ultraviolet absorber, the content of the ultraviolet absorber is preferably 0.1% to 10% by mass, more preferably 0.1% to 5% by mass, and particularly preferably 0.1% to 3% by mass, with respect to the total solid content of the coloring composition. Further, only one kind or two or more kinds of the ultraviolet absorbers may be used. In a case where two or more kinds of the ultraviolet absorbers are included, the total amount thereof preferably falls within the range.

<<Other Additives>>

Various additives such as, for example, a filler, an adhesion promoter, an antioxidant, and an aggregation inhibitor can be blended into the coloring composition of the embodiment of the present invention, as desired. Examples of these additives include the additives described in paragraph Nos. 0155 and 0156 of JP2004-295116A, the contents of which are incorporated herein by reference. Further, as the antioxidant, for example, a phenol compound, a phosphorus-based compound (for example, the compounds described in paragraph No. 0042 of JP2011-090147A), a thioether compound, or the like can be used. Examples of a commercially available product thereof include ADEKA STAB series (AO-20, AO-30, AO-40, AO-50, AO-50F, AO-60, AO-60G, AO-80, AO-330, and the like), all of which are manufactured by ADEKA. Only one kind or two or more kinds of the antioxidants may be used as a mixture of two or more kinds thereof. The coloring composition of the embodiment of the present invention can contain the sensitizers or the light stabilizers described in paragraph No. 0078 of JP2004-295116A, or the thermal polymerization inhibitors described in paragraph No. 0081 of the same publication.

There are some cases where a metal element is included in the coloring composition according to raw materials and the like, but from the viewpoint of suppression of generation of defects, or the like, the content of Group 2 elements (calcium, magnesium, and the like) in the coloring composition is preferably 50 parts per million (ppm) by mass or less, and preferably controlled to 0.01 to 10 ppm by mass. Further, the total amount of the inorganic metal salts in the coloring composition is preferably 100 ppm by mass or less, and more preferably 0.5 to 50 ppm by mass.

<Method for Preparing Coloring Composition>

The coloring composition of the embodiment of the present invention can be prepared by mixing the above-mentioned components. In the preparation of the coloring composition, the respective components may be blended at once, or the respective components may be dissolved and/or dispersed in a solvent, and then sequentially blended. Further, the order of the components to be introduced or the operational conditions during the blending is not particularly limited. For example, the coloring composition may be prepared by dissolving and/or dispersing all the components in a solvent at the same time, or by appropriately leaving the respective components in two or more solutions or dispersion liquids, and mixing them into a solution during the use (during the coating), as desired.

It is preferable that in the preparation of the coloring composition, a composition formed by mixing the respective components is filtered through a filter for the purpose of removing foreign matters, reducing defects, or the like. As the filter, any filters that have been used in the related art for filtration use and the like may be used without particular limitation. Examples of the filter include filters formed of materials including, for example, a fluorine resin such as polytetrafluoroethylene (PTFE), a polyamide-based resin such as nylon (for example, nylon-6 and nylon-6,6), and a polyolefin resin (including a polyolefin resin having a high density and/or an ultrahigh molecular weight) such as polyethylene and polypropylene (PP). Among these materials, polypropylene (including a high-density polypropylene) and nylon are preferable.

The pore diameter of the filter is suitably approximately 0.01 to 7.0 µm, preferably approximately 0.01 to 3.0 µm, and more preferably approximately 0.05 to 0.5 µm.

In addition, a fibrous filter material is also preferably used as the filter. Examples of the fibrous filter material include a polypropylene fiber, a nylon fiber, and a glass fiber. Examples of a filter using the fibrous filter material include filter cartridges of SBP type series (SBP008 and the like), TPR type series (TPR002, TPR005, and the like), or SHPX type series (SHPX003 and the like), manufactured by Roki Techno Co., Ltd.

In a case of using a filter, different filters may be combined. Here, the filtration with each of the filters may be run once or may be repeated twice or more times.

For example, filters having different pore diameters within the above-mentioned range may be combined. With regard to the pore diameter of the filter herein, reference can be made to nominal values of filter manufacturers. A commercially available filter may be selected from, for example, various filters provided by Nihon Pall Corporation (DFA4201NXEY and the like), Toyo Roshi Kaisha., Ltd., Nihon Entegris K. K. (formerly Nippon Microlith Co., Ltd.), Kitz Micro Filter Corporation, and the like.

In addition, the filtration through the first filter may be performed with only a dispersion liquid, the other components may be mixed therewith, and then the filtration through the second filter may be performed. As the second filter, a filter formed of the same material as that of the first filter, or the like can be used.

The coloring composition of the embodiment of the present invention can also be used with adjustment of its viscosity for the purposes of adjusting the state of a film surface (flatness or the like), adjusting a film thickness, or the like. The value of the viscosity can be appropriately selected as desired, and is, for example, preferably 0.3 mPa·s to 50 mPa·s, and more preferably 0.5 mPa·s to 20 mPa·s at 25° C. As for a method for measuring the viscosity, the viscosity can be measured, for example, with a temperature being adjusted to 25° C., using a viscometer RE85L (rotor: 1° 34'×R24, a measurement range of 0.6 to 1,200 mPa·s) manufactured by Toki Sangyo Co., Ltd.

The moisture content in the coloring composition of the embodiment of the present invention is usually 3% by mass or less, preferably in the range of 0.01% to 1.5% by mass, and more preferably in the range of 0.1% to 1.0% by mass. The moisture content is a value measured by a Karl Fischer method.

<Applications of Coloring Composition>

The coloring composition of the embodiment of the present invention can be preferably used for the formation of a colored layer of a color filter. The coloring composition of the embodiment of the present invention can be preferably used for a color filter for a solid-state imaging device such as a charge-coupled device (CCD) and a complementary metal-oxide semiconductor (CMOS), an image display device, or the like.

The film thickness of the color filter can be appropriately adjusted depending on purposes. The film thickness is preferably 20 µm or less, more preferably 10 µm or less, and still more preferably 5 µm or less. The lower limit film thickness is preferably 0.1 µm or more, more preferably 0.2 µm or more, and still more preferably 0.3 µm or more.

In a case where the coloring composition of the embodiment of the present invention is used in applications for a color filter for a liquid crystal display device, the voltage holding ratio of a liquid crystal display element including a color filter is preferably 70% or more, and more preferably 90% or more. Known means for obtaining a high voltage holding ratio can be incorporated as appropriate, and examples of typical means include a use of high-purity materials (for example, reduction in ionic impurities) and a control of the amount of acidic functional groups in a composition. The voltage holding ratio can be measured by, for example, the methods described in paragraph No. 0243 of JP2011-008004A, and paragraph Nos. 0123 to 0129 of JP2012-224847A.

<Method for Producing Film>

The method for producing a film of the embodiment of the present invention includes a step of applying the coloring composition of the embodiment of the present invention onto a support.

The support is not particularly limited, and can be appropriately selected depending on applications. Examples of the support include a substrate for a solid-state imaging device, in which a solid-state imaging device (light-receiving element) such as a glass substrate, a CCD, and a CMOS is provided, and a silicon substrate. Further, an undercoat layer may be provided on the support, as desired, to improve adhesion to a layer above the support, to prevent diffusion of materials, or to flatten the surface.

Examples of a method for applying the coloring composition include a spin coating method, a slit coating method, and an ink jet method. In the related art, in a case of performing coating on a support having a coating surface having floor level difference such as unevenness, striation tends to be generated, but according to the present invention, occurrence of striation can be suppressed even by the spin coating method. Thus, in the case of performing coating by the spin coating method, a particularly noticeable effect is obtained.

Furthermore, coating in the spin coating method is preferably performed at 50 to 3,000 rpm, and more preferably performed at 500 to 2,000 rpm. Incidentally, the temperature of a support in the spin coating is preferably 10° C. to 30° C., and more preferably 15° C. to 25° C. Within the range, the coating evenness is excellent, and thus, it is easy to suppress occurrence of striation.

The coating film thickness is not particularly limited, and can be appropriately adjusted depending on the applications. The coating film thickness is preferably 0.2 to 50 µm. The lower limit is more preferably 0.5 µm or more, and still more preferably 1.0 µm or more. The upper limit is more preferably 30 µm or less, and still more preferably 10 µm or less.

In the method for producing a film of the embodiment of the present invention, the coloring composition applied onto the support (coloring composition layer) may be further dried. The drying condition is not particularly limited. For example, the drying temperature is preferably 150° C. or lower, more preferably 120° C. or lower, and still more preferably 110° C. or lower. The lower limit of the drying temperature may be set, for example, to 50° C. or higher, or to 80° C. or higher. The drying time is preferably 10 seconds to 300 seconds, more preferably 40 to 250 seconds, and still more preferably 80 to 220 seconds. Drying can be performed using a hot plate, an oven, or the like.

The method for producing a film of the embodiment of the present invention may further have a step of forming a pattern. Further, in a case where a film obtained by the method for producing a film of the embodiment of the present invention is used as a flat film the step of forming a pattern may not be performed.

The step of forming a pattern preferably includes a step of patternwise exposing the coloring composition layer formed on the support (exposing step) and a step of removing the unexposed area of the coloring composition layer by development to form a pattern (developing step). A higher volume resistivity of each pattern (pixel) is desired. Specifically, the volume resistivity value of the pixel is preferably $10^9$ Ω·cm or more, and more preferably $10^{11}$ Ω·cm or more. The upper limit is not defined, but is, for example, preferably $10^{14}$ Ω·cm or less. The volume resistivity value of the pixel can be measured, for example, using an ultra high resistance meter 5410 (manufactured by Advantest Corporation). Hereinafter, the step of forming a pattern will be specifically described.

In the exposing step, it is preferable that the coloring composition layer formed on the support is patternwise exposed. For example, the coloring composition layer can be patternwise exposed by performing exposure using an exposure device such as a stepper through a mask having a predetermined mask pattern. Thus, the exposed portion can be cured. As the radiation (light) which can be used during the exposure, ultraviolet rays such as g-rays and i-rays are preferable, and i-rays are more preferable. The irradiation dose (exposure dose) is, for example, preferably 0.03 to 2.5 J/cm$^2$, and more preferably 0.05 to 1.0 J/cm$^2$.

The oxygen concentration during the exposure can be appropriately selected. The exposure can be performed in the atmosphere, and in addition, may also be performed, for example, in a low-oxygen atmosphere having an oxygen concentration of 19% by volume or less (for example, preferably 15% by volume, more preferably 5% by volume, and still more preferably, substantially oxygen-free) or in a high-oxygen atmosphere having an oxygen concentration of more than 21% by volume (for example, preferably 22% by volume, more preferably 30% by volume, and still more preferably 50% by volume). Further, the exposure illuminance can be appropriately set, and can be usually selected from the range of 1,000 W/m$^2$ to 100,000 W/m$^2$ (for example, 5,000 W/m$^2$, 15,000 W/m$^2$, and 35,000 W/m$^2$). Appropriate conditions of each of the oxygen concentration and the exposure illuminance may be combined, and for example, a combination of the oxygen concentration of 10% by volume and the illuminance of 10,000 W/m$^2$, a combination of the oxygen concentration of 35% by volume and the illuminance of 20,000 W/m$^2$, or the like is available.

Next, the unexposed area of the coloring composition layer is removed by development to form a pattern. The removal of the unexposed area of the coloring composition layer by development can be performed using a developer. As the developer, an alkali developer causing no damage on the underlying solid-state imaging device, circuit, or the like is preferable. The temperature of the developer is preferably, for example, 20° C. to 30° C. The development time is preferably 20 to 180 seconds. Further, in order to improve residue removing properties, a step of removing the developer by shaking per 60 seconds and supplying a fresh developer may be repeated several times.

As the developer, an aqueous alkaline solution obtained by diluting an alkali agent with pure water is preferably used. Examples of the alkali agent include organic alkaline compounds such as aqueous ammonia, ethylamine, diethylamine, dimethylethanolamine, diglycol amine, diethanolamine, hydroxyamine, ethylenediamine, tetramethylammonium hydroxide, tetraethylammonium hydroxide, tetrapropylammonium hydroxide, tetrabutylammonium hydroxide, benzyltrimethylammonium hydroxide, dimethylbis(2-hydroxyethyl)ammonium hydroxide, choline, pyrrole, piperidine, and 1,8-diazabicyclo[5,4,0]-7-undecene, and inorganic alkaline compounds such as sodium hydroxide, potassium hydroxide, sodium carbonate, sodium hydrogen carbonate, sodium silicate, and sodium metasilicate. The concentration of the alkali agent in the aqueous alkaline solution is preferably 0.001% to 10% by mass, and more preferably 0.01% to 1% by mass. Moreover, the developer may further include a surfactant. Examples of the surfactant include the surfactants described as the above-mentioned coloring composition, and the surfactant is preferably a nonionic surfactant.

In addition, in a case where a developer including such an aqueous alkaline solution is used, it is preferable to perform washing (rinsing) with pure water after development.

After the development, a heating treatment (post-baking) can also be performed after carrying out drying. The post-baking is a heating treatment after development so as to complete the curing of the film. In a case of performing the post-baking, the post-baking temperature is preferably, for example, 100° C. to 240° C. From the viewpoint of curing of the film, the post-baking temperature is more preferably 200° C. to 230° C. The Young's modulus of the film after post-baking is preferably 0.5 to 20 GPa, and more preferably 2.5 to 15 GPa. In addition, in a case of using an organic electroluminescence (organic EL) element as a light-emitting light source or a case of constituting a photo-electric conversion film of an image sensor with organic materials, the post-baking temperature is preferably 150° C. or lower, more preferably 120° C. or lower, still more preferably 100° C. or lower, and particularly preferably 90° C. or lower. The lower limit can be set to, for example, 50° C. or higher.

The post-baking can be performed continuously or batch-wise by using a heating means such as a hot plate, a convection oven (hot-air circulating dryer), and a high-frequency heater so that the film after development (cured film) satisfies the conditions. Further, in a case of forming a pattern by a low-temperature process, the post-baking may not be carried out.

It is preferable that a film obtained by the method for producing a film of the embodiment of the present invention has high flatness. Specifically, the surface roughness Ra is preferably 100 nm or less, more preferably 40 nm or less, and still more preferably 15 nm or less. The lower limit is not specified, but is preferably, for example 0.1 nm or more. The surface roughness can be measured, for example, using AFM (atomic force microscope) Dimension 3100 manufactured by Veeco Instruments, Inc.

In addition, the contact angle of water on the film can be appropriately set to a preferred value, but is typically in the range of 50° to 110°. The contact angle can be measured, for example, using a contact angle meter CV-DT•A Model (manufactured by Kyowa Interface Science Co., Ltd.).

By using the method for producing a film of the embodiment of the present invention, a color filter, a solid-state imaging device, an image display device, or the like can also be produced.

The configuration of the solid-state imaging device is not particularly limited as long as the device is configured to function as a solid-state imaging device. However, examples thereof include the following configurations.

The solid-state imaging device may be configured to have a plurality of photodiodes constituting a light receiving area of the solid-state imaging device (a charge coupled device (CCD) image sensor, a complementary metal-oxide semiconductor (CMOS) image sensor, or the like), and a transfer electrode formed of polysilicon or the like on a substrate; have a light-shielding film having openings only over the light receiving portion of the photodiode, on the photodiodes and the transfer electrodes; have a device-protective layer formed of silicon nitride or the like, which is formed to coat the entire surface of the light-shielding film and the light receiving portion of the photodiodes, on the light-shielding film; and have a color filter on the device-protective layer. In addition, the solid-state imaging device may also be configured, for example, such that it has a light collecting means (for example, a microlens, which is the same hereinafter) on a device-protective layer under a color filter (a side closer to the substrate), or has a light collecting means on a color filter. Further, the color filter may have a structure in which a cured film forming each color pixel is embedded in, for example, a space partitioned in a lattice shape by a partition wall. The partition wall in this case preferably has a low refractive index for each color pixel. Examples of the solid-state imaging device having such a structure include the devices described in JP2012-227478A and JP2014-179577A.

Examples of the image display device include a liquid crystal display device and an organic electroluminescence display device. The definitions of display devices or the details of the respective display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd., published in 1989)", and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and for example, the present invention can be applied to liquid crystal display devices employing various systems described in the "Liquid Crystal Display Technology for Next Generation".

EXAMPLES

Hereinbelow, the present invention will be more specifically described with reference to Examples. The materials, the amounts of materials to be used, the proportions, the treatment details, the treatment procedure, or the like shown in the Examples below may be modified, if appropriate, as long as the modifications do not depart from the spirit of the present invention. Therefore, the scope of the present invention should not be construed as being limited to the specific Examples shown below. In addition, "parts" and "%" are on a mass basis unless otherwise specified.

<Measurement of Weight-Average Molecular Weight>

The weight-average molecular weight of the resin was measured by the following method.

Types of columns: Columns formed by connection of TOSOH TSKgel Super HZM-H, TOSOH TSKgel Super HZ4000, and TOSOH TSKgel Super HZ2000

Developing solvent: Tetrahydrofuran

Column temperature: 40° C.

Flow rate (amount of a sample to be injected): 1.0 µL (sample concentration: 0.1% by mass)

Device name: HLC-8220GPC manufactured by Tosoh Corporation

Detector: Refractive index (RI) detector

Calibration curve base resin: Polystyrene

<Measurement of Surface Tension of Organic Solvent>

The surface tension of the organic solvent was measured by a plate method using a platinum plate with a surface tensiometer CBVP-Z (manufactured by Kyowa Interface Science Co., Ltd.) as a measurement device.

The value of the surface tension of the following organic solvent measured by the method was as follows. The value of the boiling point was also described therewith.

TABLE 1

| Organic solvent | Boiling point (° C.) | Surface tension (mN/m) |
|---|---|---|
| Butyl acetate | 126.1 | 24.3 |
| Propyl acetate | 96.6 | 23.8 |
| Isopropyl acetate | 89 | 21.7 |
| Ethyl acetate | 77.1 | 23.2 |
| Methyl acetate | 56.9 | 23.9 |
| PGMEA | 146 | 26.7 |
| Ethyl lactate | 154 | 29.2 |
| EEP | 169.7 | 27.1 |
| PGME | 121 | 26.8 |
| PE | 132.8 | 25.4 |
| PnP | 150 | 25.6 |
| PnB | 171.1 | 25.8 |
| DMM | 175 | 25.6 |
| Cyclohexanone | 155.6 | 33.5 |
| 2-Heptanone | 151 | 25.5 |

PGMEA is an abbreviation of propylene glycol monomethyl ether acetate.
EEP is an abbreviation of ethyl 3-ethoxypropionate.
PGME is an abbreviation of propylene glycol monomethyl ether.
PE is an abbreviation of propylene glycol monoethyl ether.
PnP is an abbreviation of propylene glycol mono-n-propyl ether.
PnB is an abbreviation of propylene glycol mono-n-butyl ether.
DMM is an abbreviation of dipropylene glycol dimethyl ether.

In addition, the surface tension of a mixed liquid of two or more organic solvents was calculated by the following formula.

$$\sum_{i=1}^{n}(A_i \times \gamma_i)$$

In the formula, $\gamma_i$ is a value (unit: mN/m) of the surface tension of an organic solvent $E_i$ included in a mixed liquid, and $A_i$ is a mass proportion of the organic solvent $E_i$ included in the mixed liquid. n is an integer of 2 or more.

[Preparation of Dispersion Liquid]

The materials shown in Table 2 below were blended in parts by mass shown in Table 2 below to prepare a mixed liquid. The mixed liquid was mixed and dispersed for 3 hours with a beads mill (a high-pressure dispersing machine with pressure reducing mechanism, NANO-3000-10 (manufactured by Nippon BEE Chemical Co., Ltd.)), using zirconia beads having a diameter of 0.3 mm, thereby preparing a dispersion liquid.

TABLE 2

|  | Dispersion liquid 1 | Dispersion liquid 2 | Dispersion liquid R-1 | Dispersion liquid R-2 |
|---|---|---|---|---|
| PB 15:6 | 4.99 | 4.99 | 4.99 | 4.99 |
| PV 23 | 1.27 | 1.27 | 1.27 | 1.27 |
| P-1 | 2.54 | 2.54 | 2.54 | 2.54 |
| PGMEA | 24.42 | 24.42 | 24.42 | 12.21 |
| Cyclohexanone | 14.62 | 0 | 14.62 | 0.62 |
| PGME | 1.03 | 1.03 | 1.03 | 0 |
| Butyl acetate | 0 | 4.62 | 0 | 27.24 |
| Propyl acetate | 0 | 10 | 0 | 0 |

The numerical values described in the table are parts by mass. Further, P-1 is a value in terms of a solid content. In addition, the raw materials described in the table are as follows.

PB 15:6 . . . C.I. Pigment Blue 15:6
PV 23 . . . C. I. Pigment Violet 23
P-1 . . . Resin with the following structure (the weight-average molecular weight is 14,000 and the numerical values shown in the main chain are molar ratios)

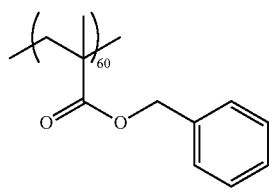

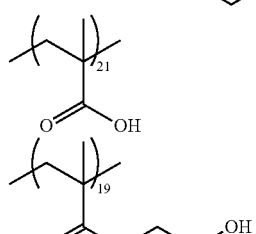

PGMEA . . . Propylene glycol monomethyl ether acetate
PGME . . . Propylene glycol monomethyl ether

[Preparation of Coloring Composition]

The materials shown in Tables 3 to 6 below were blended in parts by mass shown in Tables 3 to 6 below to produce a coloring composition.

TABLE 3

|  |  | Example 1 | Example 2 | Example 3 | Example 4 | Comparative Example 1 | Comparative Example 2 | Comparative Example 3 |
|---|---|---|---|---|---|---|---|---|
| Dispersion liquid | Dispersion liquid 1 | 48.87 | 48.87 | 48.87 | 48.87 | 0 | 0 | 0 |
|  | Dispersion liquid R-1 | 0 | 0 | 0 | 0 | 48.87 | 0 | 48.87 |
|  | Dispersion liquid R-2 | 0 | 0 | 0 | 0 | 0 | 48.87 | 0 |
| Organic solvent | PGMEA | 16.45 | 29.33 | 0.62 | 16.46 | 43.25 | 0 | 43.26 |
|  | Butyl acetate | 29.72 | 16.84 | 45.55 | 29.72 | 2.92 | 46.17 | 2.92 |
| Resin | P-2 | 1.07 | 1.07 | 1.07 | 1.07 | 1.07 | 1.07 | 1.07 |
| Polymerizable compound | M-1 | 1.62 | 1.62 | 1.62 | 1.62 | 1.62 | 1.62 | 1.62 |
|  | M-2 | 0.7 | 0.7 | 0.7 | 0.7 | 0.7 | 0.7 | 0.7 |
| Surfactant | S-1 | 0.01 | 0.01 | 0.01 | 0 | 0.01 | 0.01 | 0 |
| Photopolymerization initiator | I-1 | 1.56 | 1.56 | 1.56 | 1.56 | 1.56 | 1.56 | 1.56 |

TABLE 3-continued

|  | Example 1 | Example 2 | Example 3 | Example 4 | Comparative Example 1 | Comparative Example 2 | Comparative Example 3 |
|---|---|---|---|---|---|---|---|
| Content (% by mass) of ester-based solvent E1 in coloring composition | 40.87 | 53.75 | 25.04 | 40.88 | 67.67 | 12.21 | 67.68 |
| Content (% by mass) of organic solvent E2 in coloring composition | 29.72 | 16.84 | 45.55 | 29.72 | 2.92 | 73.41 | 2.92 |
| Mass ratio of ester-based solvent E1:organic solvent E2 | 58:42 | 76:24 | 36:65 | 58:42 | 96:4 | 14:86 | 96:4 |
| Total content (% by mass) of ester-based solvent E1 and organic solvent E2 in organic solvent E | 82 | 82 | 82 | 82 | 82 | 99 | 82 |
| Surface tension (mN/m) of organic solvent E | 27.0 | 27.4 | 26.6 | 27.0 | 27.8 | 24.7 | 27.8 |

TABLE 4

|  |  | Example 11 | Example 12 | Example 13 | Example 14 | Example 15 |
|---|---|---|---|---|---|---|
| Dispersion liquid | Dispersion liquid 1 | 48.87 | 48.87 | 48.87 | 48.87 | 0 |
|  | Dispersion liquid 2 | 0 | 0 | 0 | 0 | 48.87 |
| Organic solvent | PGMEA | 16.45 | 16.45 | 16.45 | 16.45 | 16.45 |
|  | Butyl acetate | 0 | 0 | 0 | 0 | 29.72 |
|  | Propyl acetate | 29.72 | 0 | 0 | 0 | 0 |
|  | Isopropyl acetate | 0 | 29.72 | 0 | 0 | 0 |
|  | Ethyl acetate | 0 | 0 | 29.72 | 0 | 0 |
|  | Methyl acetate | 0 | 0 | 0 | 29.72 | 0 |
| Resin | P-2 | 1.07 | 1.07 | 1.07 | 1.07 | 1.07 |
| Polymerizable compound | M-1 | 1.62 | 1.62 | 1.62 | 1.62 | 1.62 |
|  | M-2 | 0.7 | 0.7 | 0.7 | 0.7 | 0.7 |
| Surfactant | S-1 | 0.01 | 0.01 | 0.01 | 0.01 | 0.01 |
| Photopolymerization initiator | I-1 | 1.56 | 1.56 | 1.56 | 1.56 | 1.56 |
| Content (% by mass) of ester-based solvent E1 in coloring composition |  | 40.87 | 40.87 | 40.87 | 40.87 | 40.87 |
| Content (% by mass) of organic solvent E2 in coloring composition |  | 29.72 | 29.72 | 29.72 | 29.72 | 44.34 |
| Mass ratio of ester-based solvent E1:organic solvent E2 |  | 58:42 | 58:42 | 58:42 | 58:42 | 58:42 |
| Total content (% by mass) of ester-based solvent E1 and organic solvent E2 in organic solvent E |  | 82 | 82 | 82 | 82 | 99 |
| Surface tension (mN/m) of organic solvent E |  | 26.9 | 26.1 | 26.7 | 26.9 | 25.4 |

TABLE 5

|  |  | Example 21 | Example 22 | Example 23 | Example 24 | Example 25 | Example 26 | Example 27 | Example 28 | Example 29 |
|---|---|---|---|---|---|---|---|---|---|---|
| Dispersion liquid | Dispersion liquid 1 | 48.87 | 48.87 | 48.87 | 48.87 | 48.87 | 48.87 | 48.87 | 48.87 | 48.87 |
| Organic solvent | PGMEA | 16.45 | 16.45 | 16.45 | 16.45 | 16.45 | 16.45 | 16.45 | 16.45 | 16.45 |
|  | Butyl acetate | 29.72 | 29.72 | 29.72 | 29.72 | 29.72 | 29.72 | 29.72 | 29.72 | 29.72 |
| Resin | P-2 | 1.07 | 1.07 | 1.07 | 1.07 | 1.07 | 1.07 | 1.07 | 0.535 | 0.535 |
|  | P-1 | 0 | 0 | 0 | 0 | 0 | 0 | 0 | 0.535 | 0 |
|  | P-3 | 0 | 0 | 0 | 0 | 0 | 0 | 0 | 0 | 0.535 |
| Polymerizable compound | M-1 | 1.62 | 2.32 | 0 | 0 | 1.62 | 1.62 | 1.62 | 1.62 | 1.62 |
|  | M-2 | 0.7 | 0 | 0.7 | 0 | 0.7 | 0.7 | 0.7 | 0.7 | 0.7 |
|  | M-3 | 0 | 0 | 1.62 | 0 | 0 | 0 | 0 | 0 | 0 |
|  | M-4 | 0 | 0 | 0 | 2.32 | 0 | 0 | 0 | 0 | 0 |
| Surfactant | S-1 | 0.01 | 0.01 | 0.01 | 0.01 | 0 | 0.01 | 0.01 | 0.01 | 0.01 |
|  | S-2 | 0 | 0 | 0 | 0 | 0.01 | 0 | 0 | 0 | 0 |
| Photopolymerization initiator | I-1 | 1.56 | 1.56 | 1.56 | 1.56 | 1.56 | 0 | 0 | 1.56 | 1.56 |
|  | I-2 | 0 | 0 | 0 | 0 | 0 | 1.56 | 0 | 0 | 0 |
|  | I-3 | 0 | 0 | 0 | 0 | 0 | 0 | 1.56 | 0 | 0 |
| Content (% by mass) of ester-based solvent E1 in coloring composition |  | 40.87 | 40.87 | 40.87 | 40.87 | 40.87 | 40.87 | 40.87 | 40.87 | 40.87 |
| Content (% by mass) of organic solvent E2 in coloring composition |  | 29.72 | 29.72 | 29.72 | 29.72 | 29.72 | 29.72 | 29.72 | 29.72 | 29.72 |

TABLE 5-continued

|  | Example 21 | Example 22 | Example 23 | Example 24 | Example 25 | Example 26 | Example 27 | Example 28 | Example 29 |
|---|---|---|---|---|---|---|---|---|---|
| Mass ratio of ester-based solvent E1:organic solvent E2 | 58:42 | 58:42 | 58:42 | 58:42 | 58:42 | 58:42 | 58:42 | 58:42 | 58:42 |
| Total content (% by mass) of ester-based solvent E1 and organic solvent E2 in organic solvent E | 82 | 82 | 82 | 82 | 82 | 82 | 82 | 82 | 82 |
| Surface tension (mN/m) of organic solvent E | 27.0 | 27.0 | 27.0 | 27.0 | 27.0 | 27.0 | 27.0 | 27.0 | 27.0 |

TABLE 6

|  |  | Example 31 | Example 32 | Example 33 | Example 34 | Example 35 | Example 36 |
|---|---|---|---|---|---|---|---|
| Dispersion liquid | Dispersion liquid 1 | 48.87 | 48.87 | 48.87 | 48.87 | 48.87 | 48.87 |
| Organic solvent | PGMEA | 16.45 | 16.45 | 15.79 | 16.27 | 14.11 | 16.84 |
|  | Butyl acetate | 29.72 | 29.72 | 29.72 | 29.72 | 29.72 | 29.72 |
| Resin | P-2 | 1.07 | 1.07 | 2.18 | 1.37 | 5 | 0.42 |
| Polymerizable compound | M-1 | 1.62 | 1.62 | 1.86 | 1.69 | 0.96 | 1.73 |
|  | M-2 | 0.7 | 0.7 | 0.8 | 0.72 | 0.41 | 0.74 |
| Surfactant | S-1 | 0.01 | 0.01 | 0.01 | 0.01 | 0.01 | 0.01 |
| Photopolymerization initiator | I-1 | 1 | 1 |  |  | 0.92 | 1.67 |
|  | I-2 |  |  | 0.77 |  |  |  |
|  | I-3 |  |  |  | 0.69 |  |  |
| Silane coupling agent | KBM-503 | 0.56 |  |  |  | 0 | 0 |
|  | KBM-403 |  | 0.56 |  | 0.65 |  |  |
| Content (% by mass) of ester-based solvent E1 in coloring composition |  | 40.87 | 40.87 | 40.87 | 40.87 | 40.87 | 40.87 |
| Content (% by mass) of organic solvent E2 in coloring composition |  | 29.72 | 29.72 | 29.72 | 29.72 | 29.72 | 29.72 |
| Mass ratio of ester-based solvent E1:organic solvent E2 |  | 58:42 | 58:42 | 58:42 | 58:42 | 58:42 | 58:42 |
| Total content (% by mass) of ester-based solvent E1 and organic solvent E2 in organic solvent E |  | 82 | 82 | 82 | 82 | 82 | 82 |
| Surface tension (mN/m) of organic solvent E |  | 27.0 | 27.0 | 27.0 | 270 | 27.0 | 27.0 |

The numerical values described in the tables are parts by mass unless otherwise specified. Further, P-1 to P-3 are values in terms of a solid content. In addition, the raw materials described in the table are as follows.

Furthermore, the organic solvent E means an entire organic solvent included in the coloring composition. Further, the ester-based solvent E1 is an ester-based solvent having a surface tension at 25° C. of from 25 mN/m to 35 mN/m. In addition, the organic solvent E2 means an organic solvent having a surface tension at 25° C. of less than 25 mN/m.

(Resin)

P-1: The above-mentioned resin

P-2: Resin with the following structure (the weight-average molecular weight is 11,000, and the numerical values shown in the main chain are molar ratios)

P-3: Resin with the following structure (the weight-average molecular weight is 30,000, and the numerical values shown in the main chain are molar ratios)

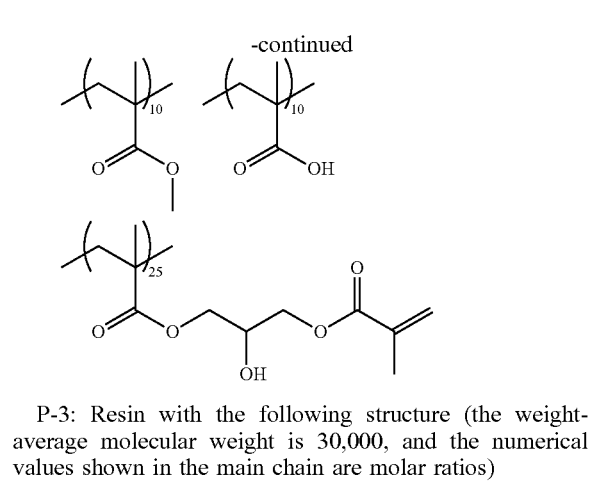

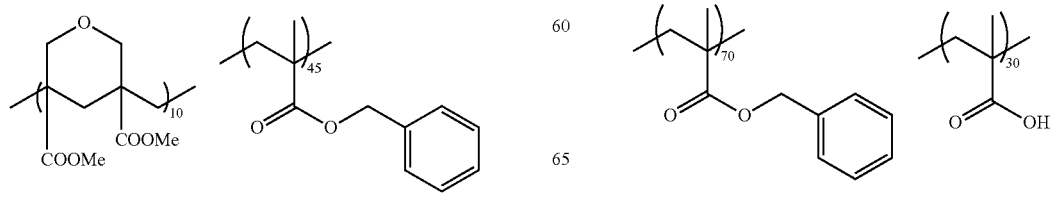

(Polymerizable Compound)

M-4: Mixture of compounds with the following structures (left compound:middle compound:right compound=40:20:40 (mass ratio))

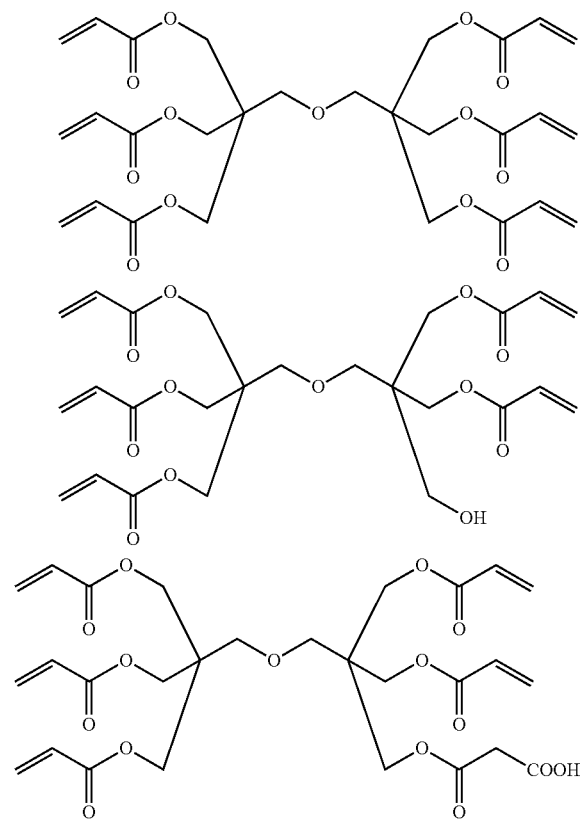

M-2: Compounds with the following structure

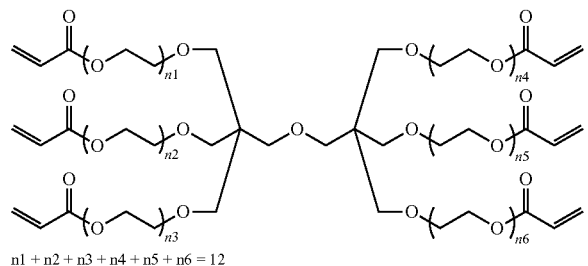

n1 + n2 + n3 + n4 + n5 + n6 = 12

M-3: ARONIX M-510 (manufactured by Toagosei Chemical Industry Co., Ltd.)

M-4: KAYARAD DPHA (manufactured by Nippon Kayaku Co., Ltd.)

(Surfactant)

S-1: The following mixture (Mw is 14,000, and % representing the ratio of repeating units is % by mass)

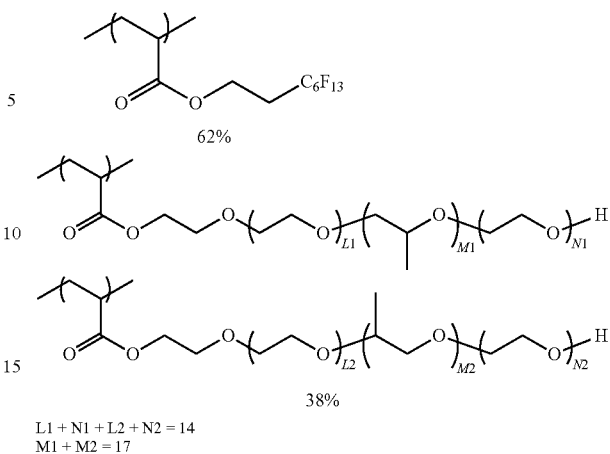

L1 + N1 + L2 + N2 = 14
M1 + M2 = 17

S-2: KF6001 (manufactured by Shin-Etsu Silicone)

(Photopolymerization Initiator)

I-1: The following compound

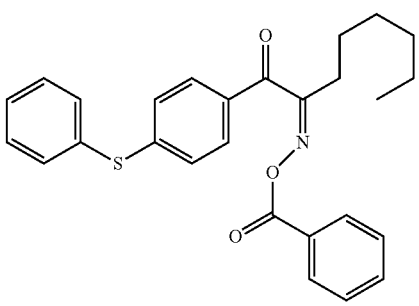 [SMILES: CCCCCC/C(=N/OC(=O)c1ccccc1)C(=O)c1ccc(Sc2ccccc2)cc1]

I-2: IRGACURE-OXE02 (manufactured by BASF)
I-3: IRGACURE-OXE03 (manufactured by BASF)

(Silane Coupling Agent)

KBM-503: 3-Methacryloxypropyl trimethoxysilane (manufactured by Shin-Etsu Chemical Co., Ltd.)

KBM-403: 3-Glycidoxypropyl trimethoxysilane (manufactured by Shin-Etsu Chemical Co., Ltd.)

<Evaluation of Striation>

By using an etching method, a pattern with floor level differences (concave portions) in size of 4 mm×5 mm and a depth of 1 μm was formed in a grid form on the entire surface of an 8-inch (1 inch=2.54 cm) silicon wafer. The distance between the floor level differences was set to 2.0 mm.

The coloring composition was applied on the silicon wafer having the pattern with floor level differences by a spin coating method, heated at 100° C. for 120 seconds using a hot plate, and then further heated at 200° C. for 300 seconds using a hot plate.

A floor level difference positioned at the mid-point between the center of the silicon wafer and the periphery portion of the silicon wafer was selected, and the corner of the floor level difference was observed with an optical microscope (at a magnification of 50). As for the corner of the floor level difference, the corner in the farthest portion from the center of the silicon wafer among the corners at four positions was observed and its striation was evaluated according to the following standard.

A: Striation was not observed.

B: Striation in less than 0.5 cm was observed.

C: Striation in 0.5 cm or more and less than 1 cm was observed.

D: Striation in 1 cm or more was observed.

<Evaluation of Residue Defects>

CT-2010 (manufactured by Fujifilm Electronic Materials Co., Ltd.) which is a photosensitive resin composition was uniformly applied on an 8-inch silicon wafer with a spin coater to form a coating film. The coating film was subjected to a heating treatment in an oven at 220° C. for 60 seconds. Further, the rotation speed in the application for spin coating was adjusted such that the film thickness of the coating film after the heating treatment reached 1.0 µm. In this manner, a silicon wafer with an undercoat layer was obtained.

Each coloring composition was applied (spin-coated) onto the silicon wafer with an undercoat layer obtained above, using a spin coater, such that the film thickness after the post-baking reached 1.0 µm, and subjected to a heating treatment (pre-baking) for 120 seconds using a hot plate at 100° C.

Subsequently, pattern exposure was performed using an i-ray stepper exposure device FPA-3000i5+ (manufactured by Canon Inc.). The pattern exposure was performed at 399 points in total in the pattern aligned in the form of a matrix with 21 rows×19 columns. Here, in the 21$^{st}$ row in the matrix, the minimum exposure dose was 500 J/m$^2$ and the exposure dose incremented at an interval of 500 J/m$^2$ from 500 J/m$^2$ in each successive row. Further, in the 19$^{th}$ column, the focal length varied at an interval of 0.1 µm from the optimum value of the focal length (Focus of 0.0 µm) at the center. That is, conditions were set to allow the focal length to vary in each successive column from the optimum values of the focal length at the center in the 1$^{st}$ column, a photomask was used to form an image such that square pixel patterns at a 2.0-µm angle were arrayed within the range of 4 mm×3 mm.

Thereafter, the silicon wafer having the exposed coating film formed thereon was placed on a horizontal rotary table of a spin-shower developing machine (DW-30 Type, manufactured by Chemitronics Co., Ltd.) and subjected to puddle development at 23° C. for 60 seconds using CD-2060 (manufactured by Fujifilm Electronic Materials Co., Ltd.) to form a colored pattern on the silicon wafer.

The silicon wafer having the colored pattern formed thereon was subjected to a rinsing treatment with pure water and then spin-dried. Further, the silicon wafer was subjected to a heat treatment (post-baking) for 300 seconds using a hot plate at 200° C. to obtain a silicon wafer having a colored pattern (colored pixels).

<Evaluation>

The colored pattern formed on the silicon wafer obtained above was measured and evaluated using a critical scanning electron microscope (SEM) (S-9260, manufactured by Hitachi, Ltd.). The evaluation standards are shown below. A and B are at practical levels.

<Evaluation Standards>

A: Dissolved residues were not observed in the unexposed area.

B: Dissolved residues were observed only in the skirt of patterns as the unexposed area.

C: Many dissolved residues were observed throughout the unexposed area.

TABLE 7

|  | Example 1 | Example 2 | Example 3 | Example 4 | Comparative Example 1 | Comparative Example 2 | Comparative Example 3 |
|---|---|---|---|---|---|---|---|
| Striation | A | B | A | A | D | C | D |
| Residue defects | A | A | A | A | B | C | A |

TABLE 8

|  | Example 11 | Example 12 | Example 13 | Example 14 | Example 15 |
|---|---|---|---|---|---|
| Striation | A | A | A | A | A |
| Residue defects | A | A | B | B | A |

TABLE 9

|  | Example 21 | Example 22 | Example 23 | Example 24 | Example 25 | Example 26 | Example 27 | Example 28 | Example 29 |
|---|---|---|---|---|---|---|---|---|---|
| Striation | A | A | A | A | A | A | A | A | A |
| Residue defects | A | A | A | A | A | A | A | A | A |

TABLE 10

|  | Example 31 | Example 32 | Example 33 | Example 34 | Example 35 | Example 36 |
|---|---|---|---|---|---|---|
| Striation | A | A | A | A | A | A |
| Residue defects | A | A | A | A | A | A |

As seen from the above results, it was possible to suppress occurrence of striation. It was also possible to suppress generation of residue defects. In contrast, striation more easily occurred in Comparative Examples, as compared with Examples.

What is claimed is:

1. A coloring composition comprising:
   a coloring agent A;
   a resin B;
   a polymerizable compound C;
   a photopolymerization initiator D; and
   an organic solvent E,
   wherein the organic solvent E includes an ester-based solvent E1 having a surface tension at 25° C. of from 25 mN/m to 35 mN/m, an organic solvent E2 having a surface tension at 25° C. of less than 25 mN/m, a ratio of a mass of the ester-based solvent E1 to a mass of the organic solvent E2 is 60:40 to 30:70 in terms of the ratio of the mass of the ester-based solvent E1:the mass of the organic solvent E2, and the organic solvent E contains 50% by mass or more of a combination of the ester-based solvent E1 and the organic solvent E2 with respect to the total mass of the organic solvent E.

2. The coloring composition according to claim 1, wherein the boiling point of the organic solvent E2 is 50° C. to 135° C.

3. The coloring composition according to claim 1, wherein the boiling point of the ester-based solvent E1 is 140° C. to 180° C.

4. The coloring composition according to claim 1, wherein the organic solvent E2 has a solubility in 100 g of water at 25° C. of 30 g or less.

5. The coloring composition according to claim 1, wherein the ester-based solvent E1 is a compound having an ether bond and an ester bond, and the organic solvent E2 is a compound having an ester bond.

6. The coloring composition according to claim 1, wherein the ester-based solvent E1 is at least one selected from propylene glycol monomethyl ether acetate, propylene glycol monoethyl ether acetate, and ethyl 3-ethoxypropionate.

7. The coloring composition according to claim 1, wherein the organic solvent E2 is a compound represented by Formula (E2-1);

$$Re^{e1}—C(=O)—O—Re^{e2} \quad (E2-1)$$

in the formula, $R^{e1}$ and $Re^{e2}$ each independently represents a hydrocarbon group.

8. The coloring composition according to claim 1, wherein the organic solvent E2 is at least one selected from methyl acetate, ethyl acetate, propyl acetate, isopropyl acetate, and butyl acetate.

9. The coloring composition according to claim 1, wherein the organic solvent E includes a ketone-based solvent E3.

10. The coloring composition according to claim 1, wherein the surface tension at 25° C. of the organic solvent E is from 22 mN/m to 29 mN/m.

11. The coloring composition according to claim 1, wherein the coloring composition includes 40% to 95% by mass of the organic solvent E.

12. The coloring composition according to claim 1, wherein the polymerizable compound C includes a polymerizable compound having an acid group.

13. A method for producing a film, comprising applying the coloring composition according to claim 1 onto a support.

14. The method for producing a film according to claim 13, further comprising forming a pattern.

15. The coloring composition according to claim 1, wherein the coloring agent A comprises at least one of C. I. Pigment Blue 15:6 and C. I. Pigment Violet 23, and the content of the coloring agent A is 30% by mass or more with respect to the total solids content of the coloring composition.

16. The coloring composition according to claim 1, wherein the coloring agent A comprises at least one of C. I. Pigment Blue 15:6 and C. I. Pigment Violet 23, the content of the coloring agent A is 30% by mass or more with respect to the total solids content of the coloring composition, and the surface tension at 25° C. of the organic solvent E is 22 mN/m to 27.2 mN/m.

17. The coloring composition according to claim 1, wherein the coloring agent A comprises C. I. Pigment Blue 15:6 and C. I. Pigment Violet 23, and the content of the coloring agent A is 30% by mass or more with respect to the total solids content of the coloring composition.

18. The coloring composition according to claim 1, wherein the coloring agent A consists of C. I. Pigment Blue 15:6 and C. I. Pigment Violet 23, and the content of the coloring agent A is 30% by mass or more with respect to the total solids content of the coloring composition.

19. The coloring composition according to claim 1, wherein the coloring agent A consists of C. I. Pigment Blue 15:6 and C. I. Pigment Violet 23, the content of the coloring agent A is 30% by mass or more with respect to the total solids content of the coloring composition, and the organic solvent E2 is butyl acetate.

* * * * *